(12) United States Patent
Watanabe

(10) Patent No.: US 8,264,064 B2
(45) Date of Patent: Sep. 11, 2012

(54) SEMICONDUCTOR DEVICE

(75) Inventor: Kenichi Watanabe, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 157 days.

(21) Appl. No.: 12/702,729

(22) Filed: Feb. 9, 2010

(65) Prior Publication Data
US 2010/0219508 A1 Sep. 2, 2010

(30) Foreign Application Priority Data
Feb. 27, 2009 (JP) ................. 2009-047253

(51) Int. Cl.
*H01L 29/06* (2006.01)
(52) U.S. Cl. ......... 257/618; 257/E21.546; 257/E21.536; 257/E23.002; 257/639; 438/424; 438/652
(58) Field of Classification Search .......... 438/424; 257/758
See application file for complete search history.

(56) References Cited

U.S. PATENT DOCUMENTS

| | | | |
|---|---|---|---|
| 7,550,850 B2* | 6/2009 | Nakashiba | 257/758 |
| 7,883,823 B2* | 2/2011 | Ishiwata | 430/22 |
| 7,939,913 B2* | 5/2011 | Watanabe et al. | 257/620 |
| 7,969,008 B2 | 6/2011 | Nagai | |
| 2002/0125577 A1* | 9/2002 | Komada | 257/774 |
| 2005/0116333 A1* | 6/2005 | Akiyama | 257/698 |
| 2007/0170591 A1* | 7/2007 | Yamanoue et al. | 257/758 |
| 2008/0017965 A1* | 1/2008 | Nomura et al. | 257/685 |
| 2008/0258262 A1* | 10/2008 | Nagai | 257/535 |

FOREIGN PATENT DOCUMENTS

| | | |
|---|---|---|
| JP | 62-147729 A | 7/1987 |
| JP | 5-136020 A | 6/1993 |
| JP | 6-188313 A | 7/1994 |
| JP | 2008-027934 A | 2/2008 |
| KR | 2008-0077287 A | 8/2008 |

OTHER PUBLICATIONS

Korean Office Action dated May 19, 2011, issued in corresponding Korean Patent Application No. 10-2010-0017977.

* cited by examiner

*Primary Examiner* — N Drew Richards
*Assistant Examiner* — Ankush Singal
(74) *Attorney, Agent, or Firm* — Westerman, Hattori, Daniels & Adrian, LLP

(57) ABSTRACT

A semiconductor device includes a semiconductor substrate on which an internal circuit is formed in a central position an insulating layer formed over the semiconductor substrate, and a moisture-resistant ring formed by a metal plug embedded in the insulating layer, the moisture-resistant ring surrounding the internal circuit, the moisture-resistant ring extending over the semiconductor substrate in a shape, the moisture-resistant ring including a first extending portion linearly extending in a first direction in parallel to the surface of the semiconductor substrate, a vertical portion connected to the first extending portion extending in a second direction orthogonal to the first extending portion, and a second extending portion orthogonal to the vertical portion and parallel to the surface of the semiconductor substrate, the second extending portion spaced apart from the first extending portion, the second extending portion crossing the vertical portion.

21 Claims, 36 Drawing Sheets

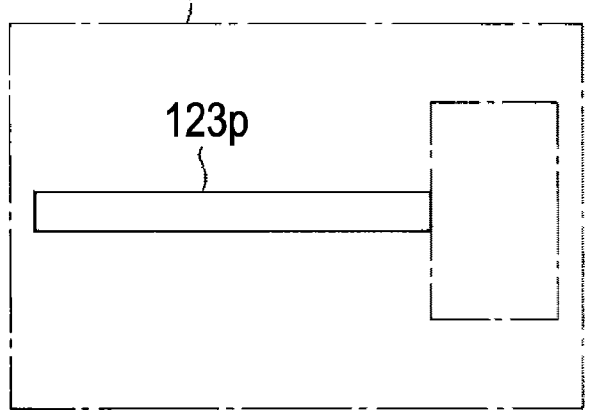
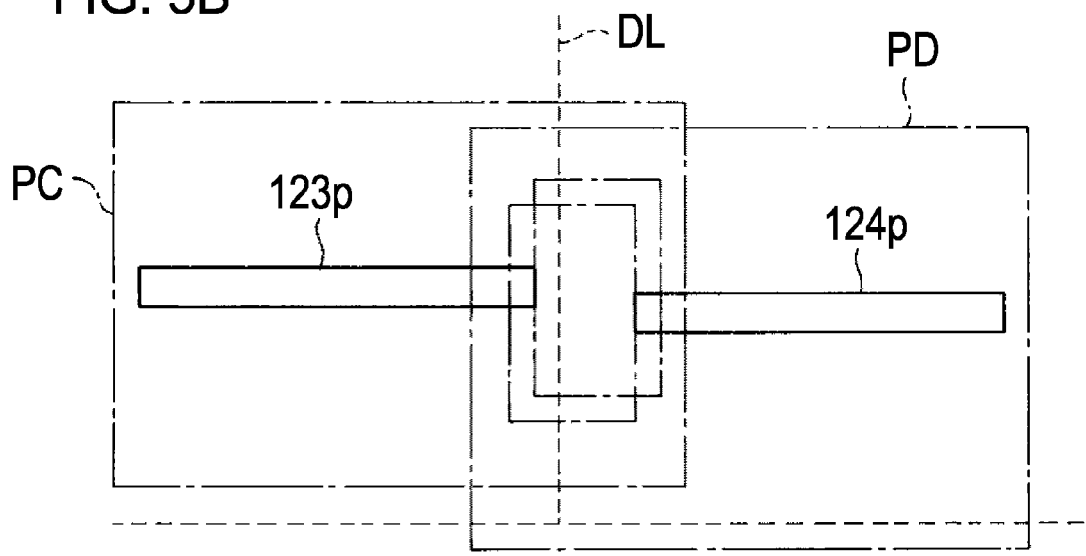
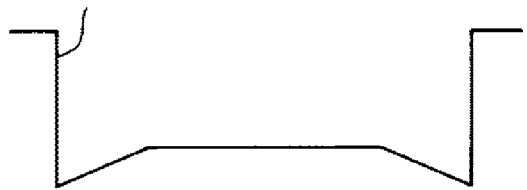

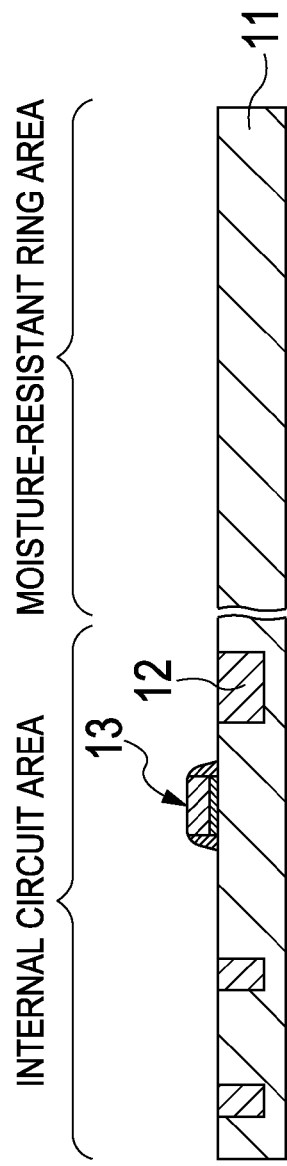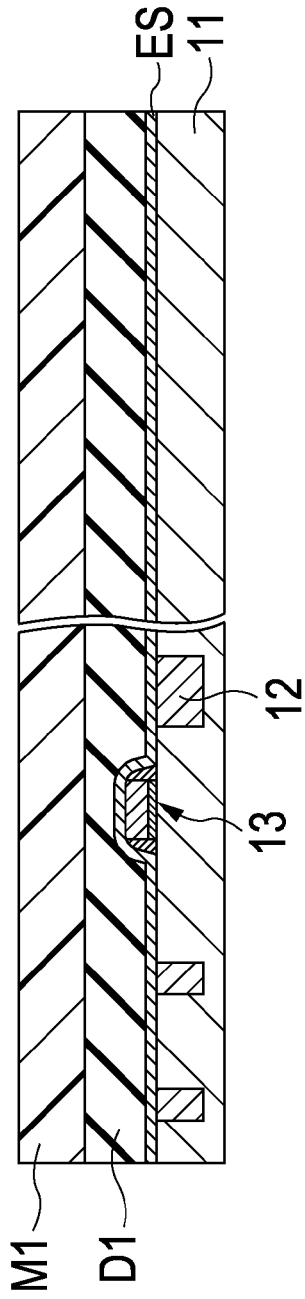

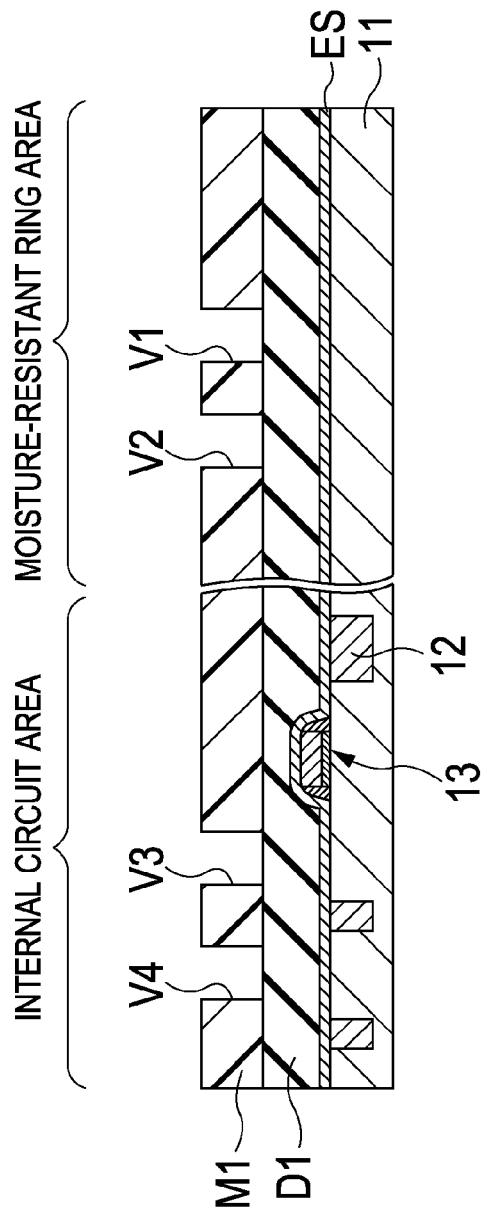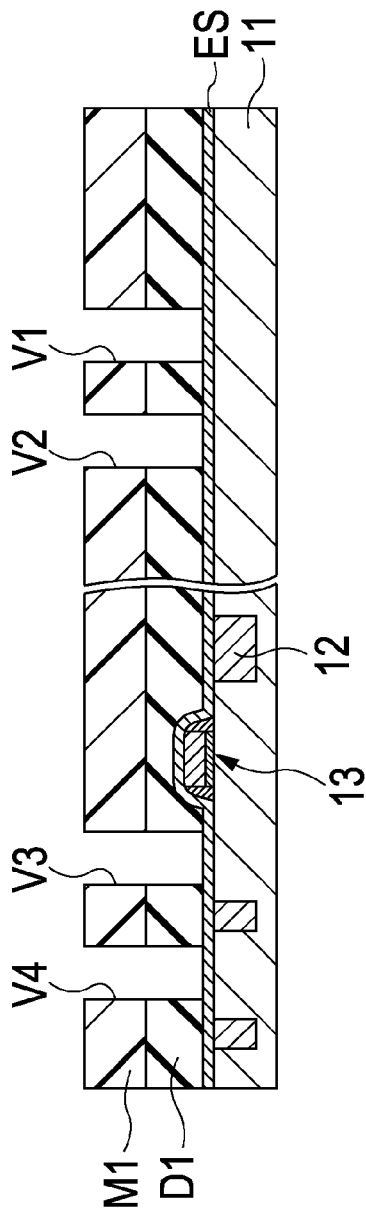

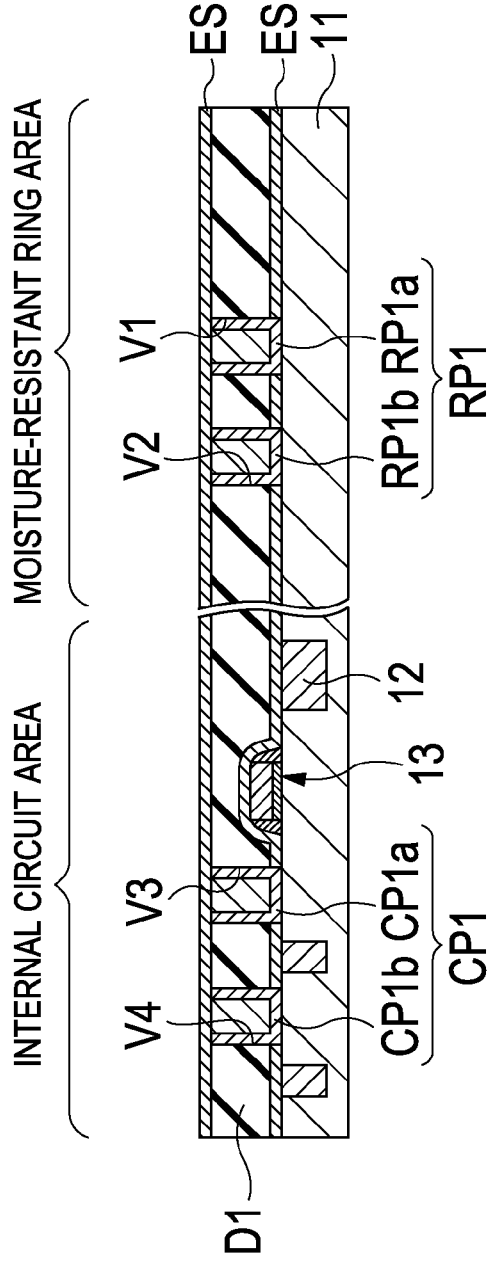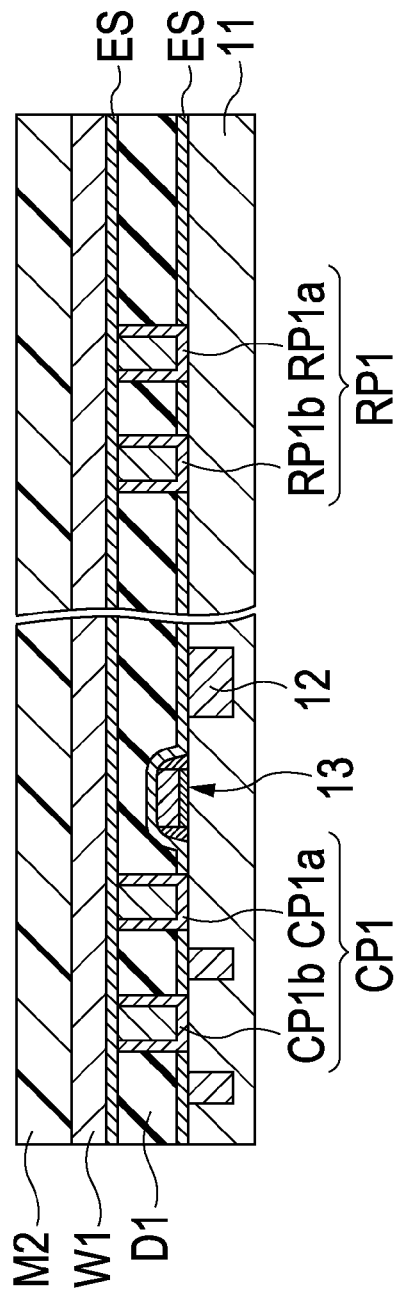

SEMICONDUCTOR DEVICE

CROSS-REFERENCE TO RELATED APPLICATION

This application is based upon and claims the benefit of priority of the prior Japanese Patent Application No. 2009-47253 filed on Feb. 27, 2009, the entire contents of which are incorporated herein by reference.

FIELD

An aspect of the embodiments discussed herein is directed to a semiconductor device including a moisture-resistant ring.

BACKGROUND

In the related art, as illustrated in FIG. 1, a semiconductor device 100 includes an internal circuit 130 and an annular moisture-resistant ring 120 surrounding the internal circuit 130. The moisture-resistant ring 120 is formed continuously around the internal circuit 130 so as to prevent moisture from entering the internal circuit from the outside of the semiconductor device 100.

The semiconductor device 100 is formed by laminating an insulating layer and a wiring layer on a semiconductor substrate. The internal circuit 130 includes a circuit element formed on the semiconductor substrate, a plug portion formed in the insulating layer, and a wiring portion formed in the wiring layer. In the same manner, the moisture-resistant ring 120 includes a plug portion formed in the insulating layer and a wiring portion formed in the wiring layer. The moisture-resistant ring 120 has a structure in which the plug portions and the wiring portions are laminated alternately on the semiconductor substrate. In this manner, the moisture-resistant ring 120 is formed continuously around the internal circuit 130 and forms a wall for preventing the entry of moisture in the direction of the depth on the semiconductor substrate.

Japanese Laid-open Patent Publication No. 1993-136020 discusses auxiliary patterns including respective pairs of the wiring patterns passing through the divided line of the wiring patterns of the semiconductor device. Japanese Laid-open Patent Publication No. 2008-27934 discusses a first moisture-resistant ring surrounding the plurality of semiconductor chips individually and a second moisture-resistant ring surrounding the plurality of semiconductor chips entirely.

SUMMARY

According to an aspect of an embodiment, a semiconductor device includes a semiconductor substrate on which an internal circuit is formed in a central position an insulating layer formed over the semiconductor substrate, and a moisture-resistant ring formed by a metal plug embedded in the insulating layer, the moisture-resistant ring surrounding the internal circuit, the moisture-resistant ring extending over the semiconductor substrate in a shape, the moisture-resistant ring including a first extending portion linearly extending in a first direction in parallel to the surface of the semiconductor substrate, a vertical portion connected to the first extending portion extending in a second direction orthogonal to the first extending portion, and a second extending portion orthogonal to the vertical portion and parallel to the surface of the semiconductor substrate, the second extending portion spaced apart from the first extending portion, the second extending portion crossing the vertical portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A-5C are drawings for explaining a method to perform exposure on the semiconductor device having the moisture-resistant ring with the plurality of masks according to another method;

FIGS. 16A and 16B are drawings illustrating an embodiment of a method of manufacturing of the semiconductor device disclosed in this specification;

FIGS. 20A and 20B are drawings illustrating a process continuing from FIG. 19;

FIGS. 21A and 21B are drawings illustrating a process continuing from FIG. 20;

DESCRIPTION OF EMBODIMENTS

As described previously, in recent years, semiconductor devices having large dimensions are manufactured in association with increase in number of circuit elements to be mounted on one semiconductor device.

Figure 1:
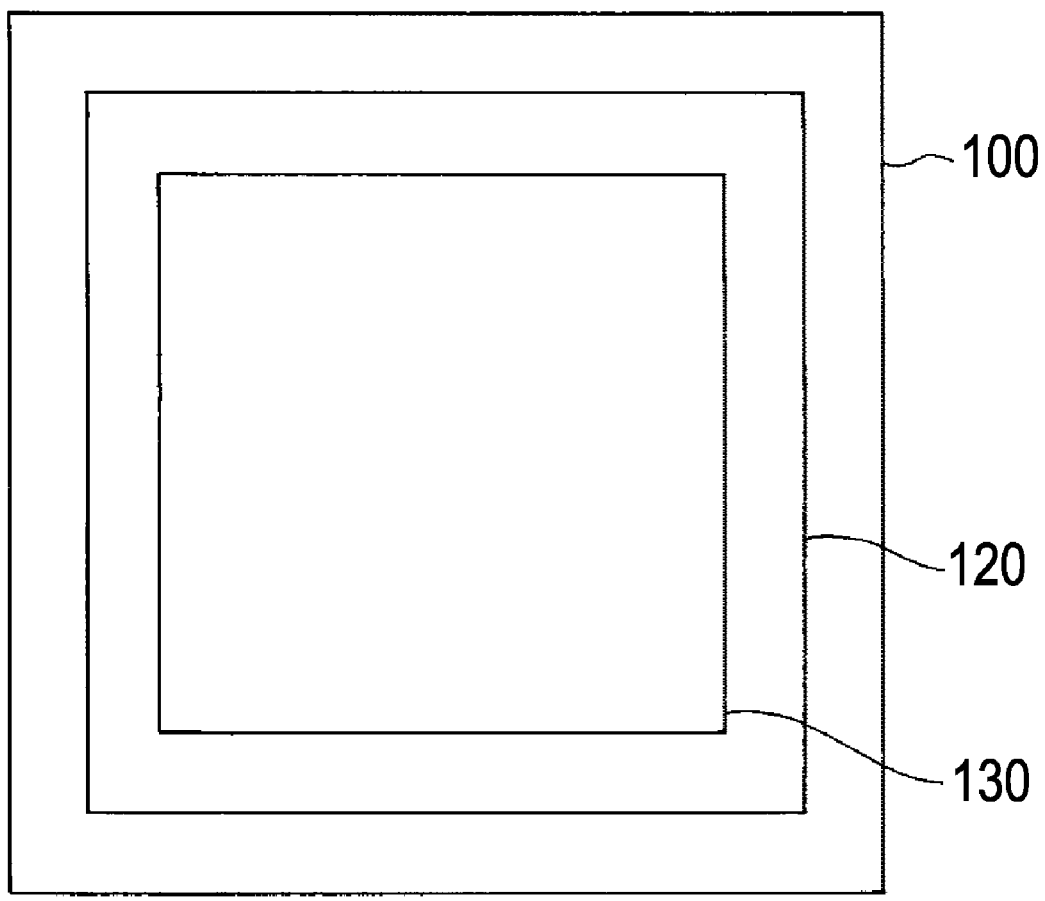
FIG. 1 is a drawing illustrating a semiconductor device provided with a moisture-resistant ring according to an example in the related art.
Figure 2A:
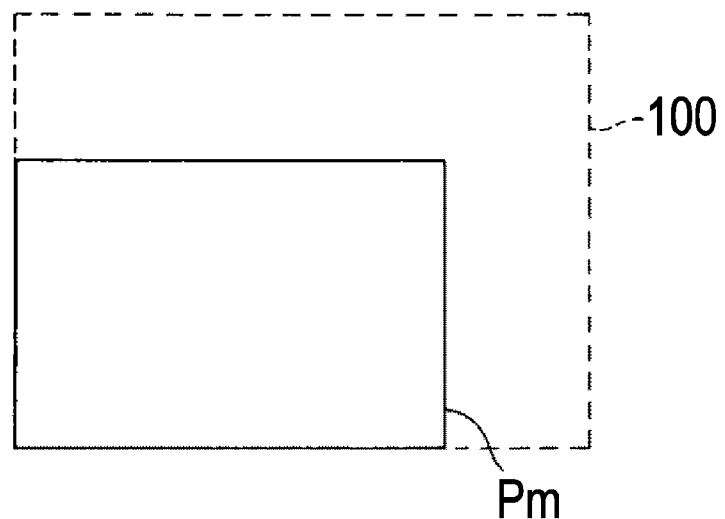
FIG. 2A is a drawing illustrating a mask and a semiconductor device having larger dimensions than an exposed portion with the mask.

In a process of manufacturing the semiconductor device, a technology of photolithography is employed, and a circuit pattern of a mask is formed on a mask layer by exposure such as photoresist or the like on the semiconductor substrate. Then, as illustrated in FIG. 2A, there is a case where the semiconductor device 100 having dimensions larger than dimensions of an exposed portion Pm with the mask is manufactured.

Figure 2B:
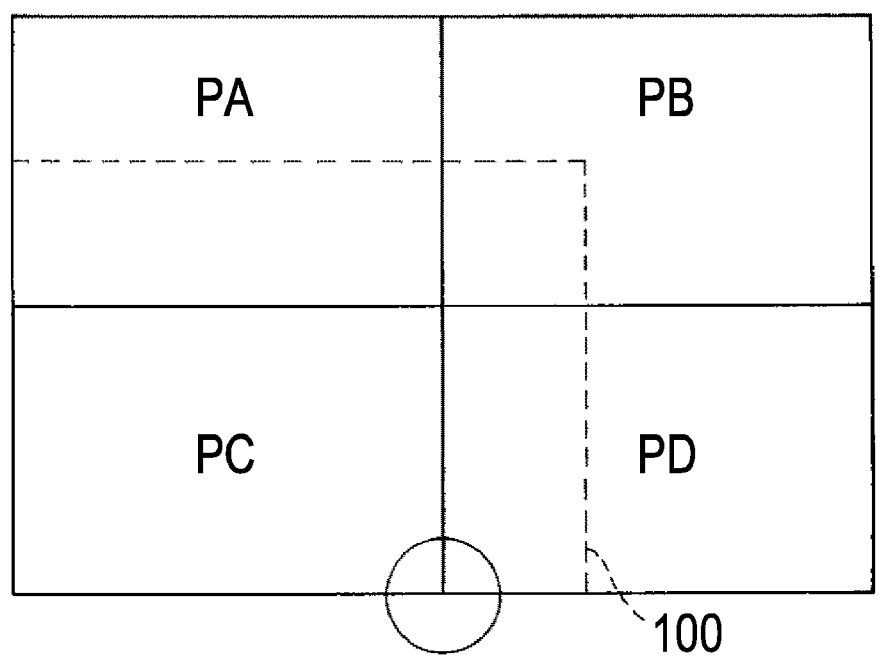
FIG. 2B is a drawing for explaining a method to perform exposure on the semiconductor device with a plurality of the masks in the related art.

In such a case, as illustrated in FIG. 2B for example, a plurality of masks PA, PB, PC, and PD are fabricated, and the circuit pattern is formed by exposure on the mask layer on the semiconductor substrate with these masks.

In the example illustrated in FIG. 2B, the semiconductor device 100 is divided into four divided areas, and the respective divided areas are exposed with the four masks PA, PB, PC, and PD for the convenience of design. In this manner, when exposing by dividing an area into a plurality of divided areas, connection with a pattern in an adjacent area becomes an issue to be addressed.

The adjacent divided areas are subjected to a bridge exposure so as to overlap partly. When the wiring portion of the internal circuit 130 extends over the both adjacent divided areas, it is necessary to make the wiring portions continued in an overlapped portion. Therefore, in the overlapped portion, even though exposed positions of the adjacent divided areas are displaced, measures such as increasing the thickness of the wiring portions or making the wiring portions in the adjacent divided areas to be an intersecting pattern are taken so as to ensure the connection of the wiring portions in the adjacent divided areas. In other words, conditions of respective working processes for the wiring layer are set to enable the working of thick wiring portion as well.

In contrast, the plug portions of the internal circuit 130 are adapted not to be arranged in the overlapped portion for the convenience of design. The plug portions are formed by embedding conductors in via holes, which are small holes. Conditions of respective working processes for the insulating layer having the plug portions formed therein are optimized for working on a small width.

As described above, the moisture-resistant ring is the wall formed on the wiring layer and the insulating layer and is required to be continued across the adjacent divided areas. When forming the moisture-resistant ring in the wiring layer, since the conditions of the respective processes for the wiring layer are set to enable the working of the thick wiring portions, a known technology to ensure the connection of the wiring portions in the adjacent divided areas may be applied.

In contrast, when forming the moisture-resistant ring in the insulating layer, the conditions of the respective processes for working the insulating layer as described above are optimized for working the small width, the technology to ensure the connection of the wiring portions in the adjacent divided areas may not be applied. Subsequently, problems which arise when forming the moisture-resistant ring on the insulating layer will be described.

Subsequently, an example of a case where the moisture-resistant ring is formed by exposure in a portion surrounded by a circle in FIG. 2B to be exposed with the mask PC and the mask PB will be described below with reference to FIGS. 3A-3C.

Figure 3A:
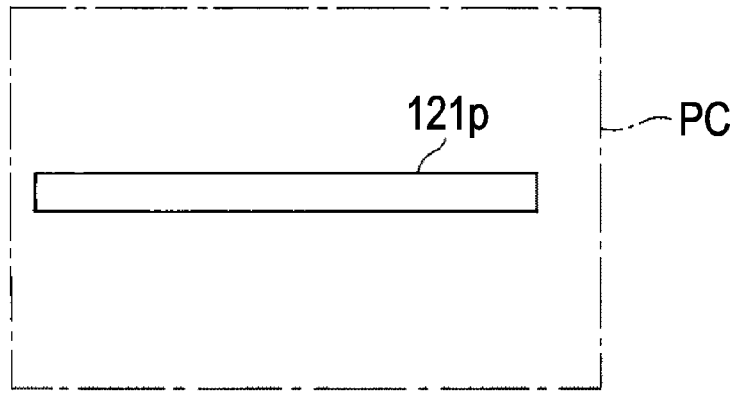
FIGS. 3A-3C are drawings for explaining a method to form exposure on the semiconductor device having the moisture-resistant ring with the plurality of masks in the related art.
Figure 3B:
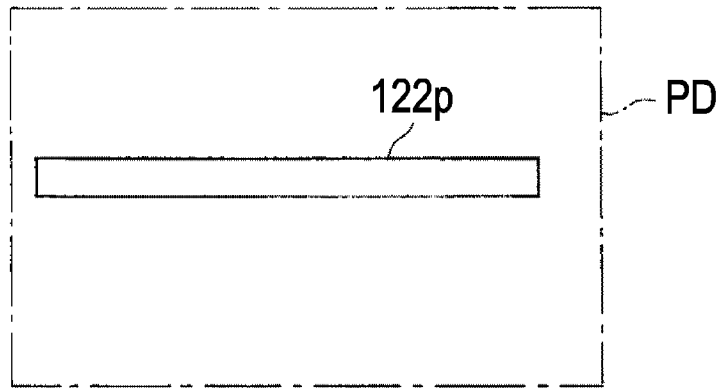
Figure 3C:
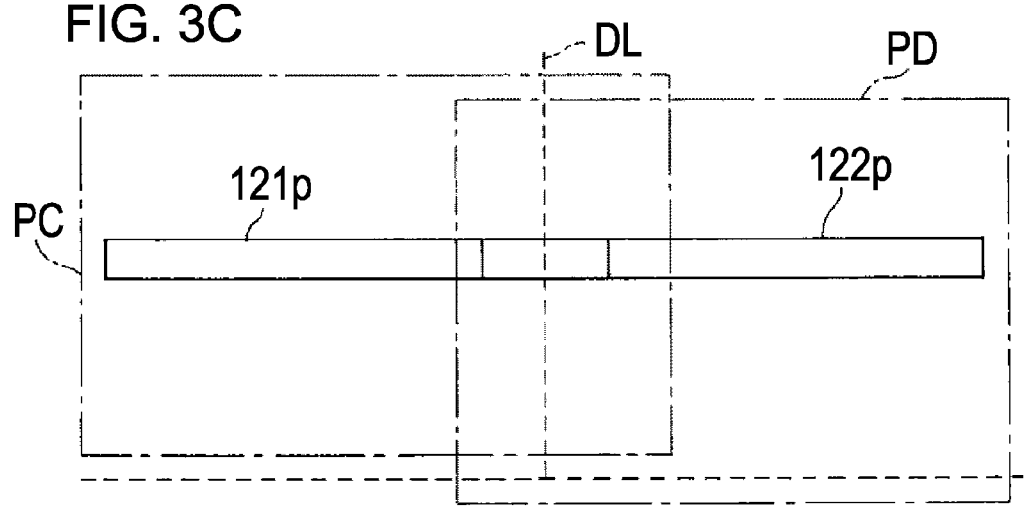

FIGS. 3A-3C are drawings for explaining a method o to perform exposure on a semiconductor device having the moisture-resistant ring with the plurality of masks in the related art. Patterns illustrated in FIGS. 3A and 3B indicate patterns for forming the plug portions of the moisture-resistant ring.

As illustrated in FIG. 3A, the mask PC having a pattern 121p for the plug portion of the moisture-resistant ring is fabricated.

Subsequently, as illustrated in FIG. 3B, the mask PD having a pattern 122p for the plug portion of the moisture-resistant ring is fabricated.

Subsequently, as illustrated in FIG. 3C, a pattern of the moisture-resistant ring is formed on the mask layer on the semiconductor substrate by exposure so that a portion to be exposed with the pattern 121p of the mask PC and a portion to be exposed with the pattern 122p of the mask PD are overlapped with each other. A dividing line DL for the convenience of design of the semiconductor device is illustrated in FIG. 3C.

As illustrated in FIG. 3C, the exposed mask layer is used as a mask, and a groove-shaped via is formed on the insulating layer, and then the conductor is embedded in the groove-shaped via to form the plug portion of the moisture-resistant ring.

When the mask pattern is formed on the mask layer by exposure, there is a case where a position of the mask layer where the mask pattern is actually formed by exposure is displaced with respect to a position of the mask layer where the mask pattern may be formed by exposure.

Figure 4A:
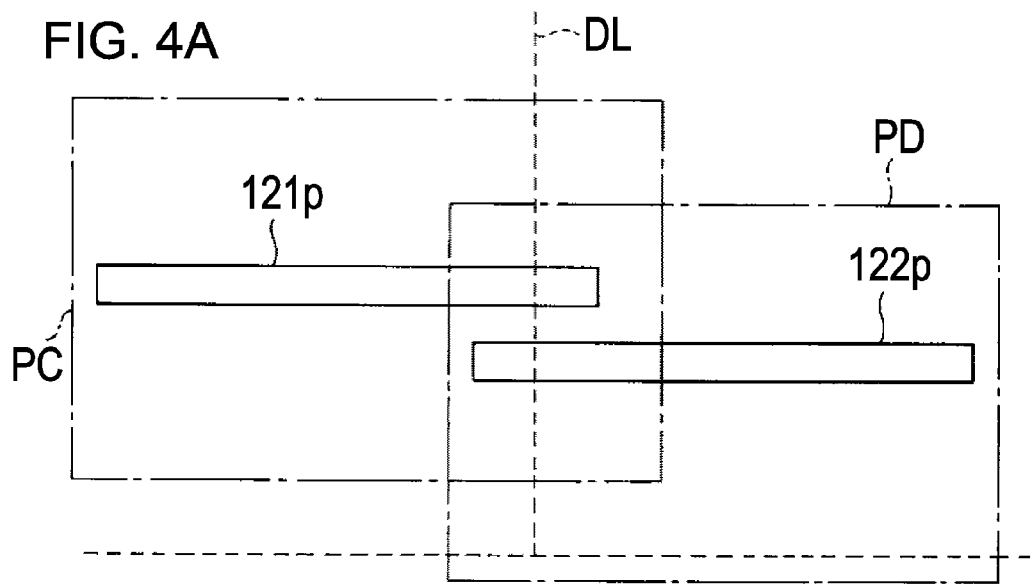
FIG. 4A illustrates a state in which exposure is performed with the two masks apart from each other in position.

For example, when a pattern is formed on the mask layer on the semiconductor substrate by exposure with the mask PC or the mask PD displaced in position as illustrated in FIG. 4A, there is a case where an exposed portion on the mask layer with the pattern 121p and an exposed portion with the pattern 122p are apart from each other. The moisture-resistant ring formed by such exposure may not prevent entry of moisture in the internal circuit sufficiently.

Figure 4B:
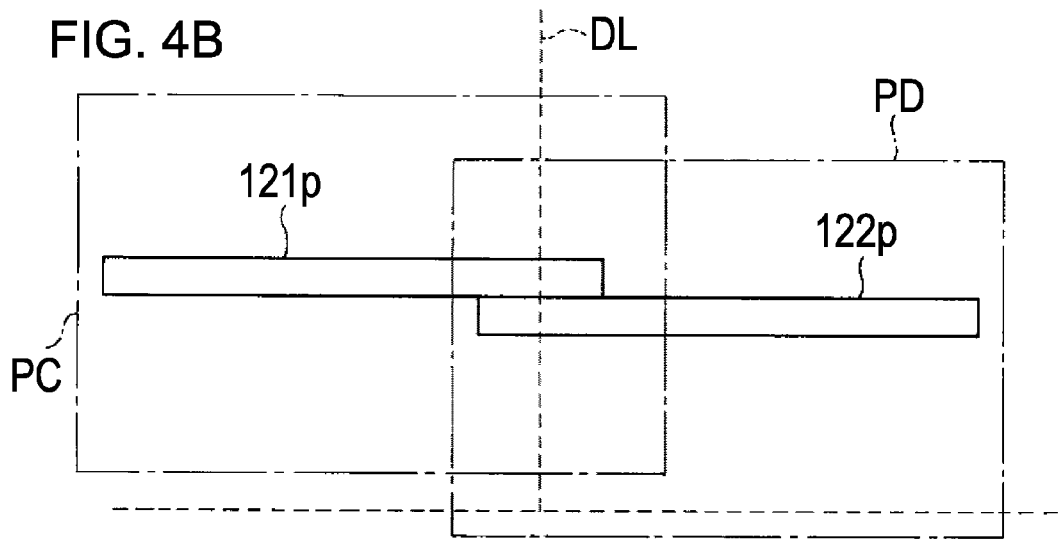
FIG. 4B illustrates a state in which exposure is performed with the two masks in contact with each other in position.
Figure 4C:
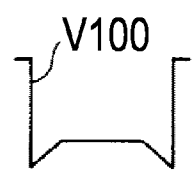
FIG. 4C is a cross-sectional view illustrating a groove-shaped via formed by the exposure in FIG. 4B.

Also, when a pattern is formed on the mask layer by exposure with the mask PC or the mask PD displaced as illustrated in FIG. 4B, the exposed portion on the mask layer with the pattern 121p and the exposed portion with the pattern 122p are in contact with each other. Since the insulating layer formed by such exposure has the groove-shaped via having a large opening area, there may be a case where defective etching occurs on a bottom portion of the via at the time of etching process as illustrated in FIG. 4C.

In the related art, a technology to form the wiring portion on the wiring layer extending across the divided areas by exposing the adjacent divided areas with the plurality of masks is disclosed. However, when this technology is used for forming the plug portion of the moisture-resistant ring, the problem as illustrated in FIG. 4B or FIG. 4C may arise.

Subsequently, there are given drawings for explaining another method to perform exposure on the semiconductor device having the moisture-resistant ring with a plurality of the mask patterns will be described with reference to FIGS. 5A-5C.

First of all, as illustrated in FIG. 5A, the mask PC having a pattern 123p of the moisture-resistant ring is fabricated. The pattern 123p includes a rectangular pattern having a large surface area at one end. The other mask PD also has a similar pattern 124p as illustrated in FIG. 5B.

In this manner, the pattern 123p and the pattern 124p respectively have the rectangular patterns having large surface areas at opposing ends. Therefore, even when exposure is performed on the mask layer on the semiconductor substrate with the mask PC or the mask PD displaced in position as illustrated in FIG. 5B, an exposed portion on the mask layer with the pattern 123p and an exposed portion with the pattern 124p are prevented from coming apart from each other.

However, since the insulating layer formed by such exposure has the groove-shaped via having the large opening area, there may be a case where the defective etching occurs on the bottom portion of the via at the time of the etching process as illustrated in FIG. 5C. When the conductor is embedded in the via having the large opening surface area, defective embedding of the conductor may occur.

As described above, a method of forming the plug portion of the moisture-resistant ring formed so as to extend across the divided areas so as to be continued without having the defective formation of the groove-shaped via or the defective embedding of the conductor is not disclosed so far.

Subsequently, preferred embodiments of a semiconductor device disclosed in this specification will be described with reference to FIG. 6 to FIG. 9. However, the technical scope of the embodiments is not limited to these embodiments and includes the invention disclosed in Claims and equivalents thereof.

Figure 6:
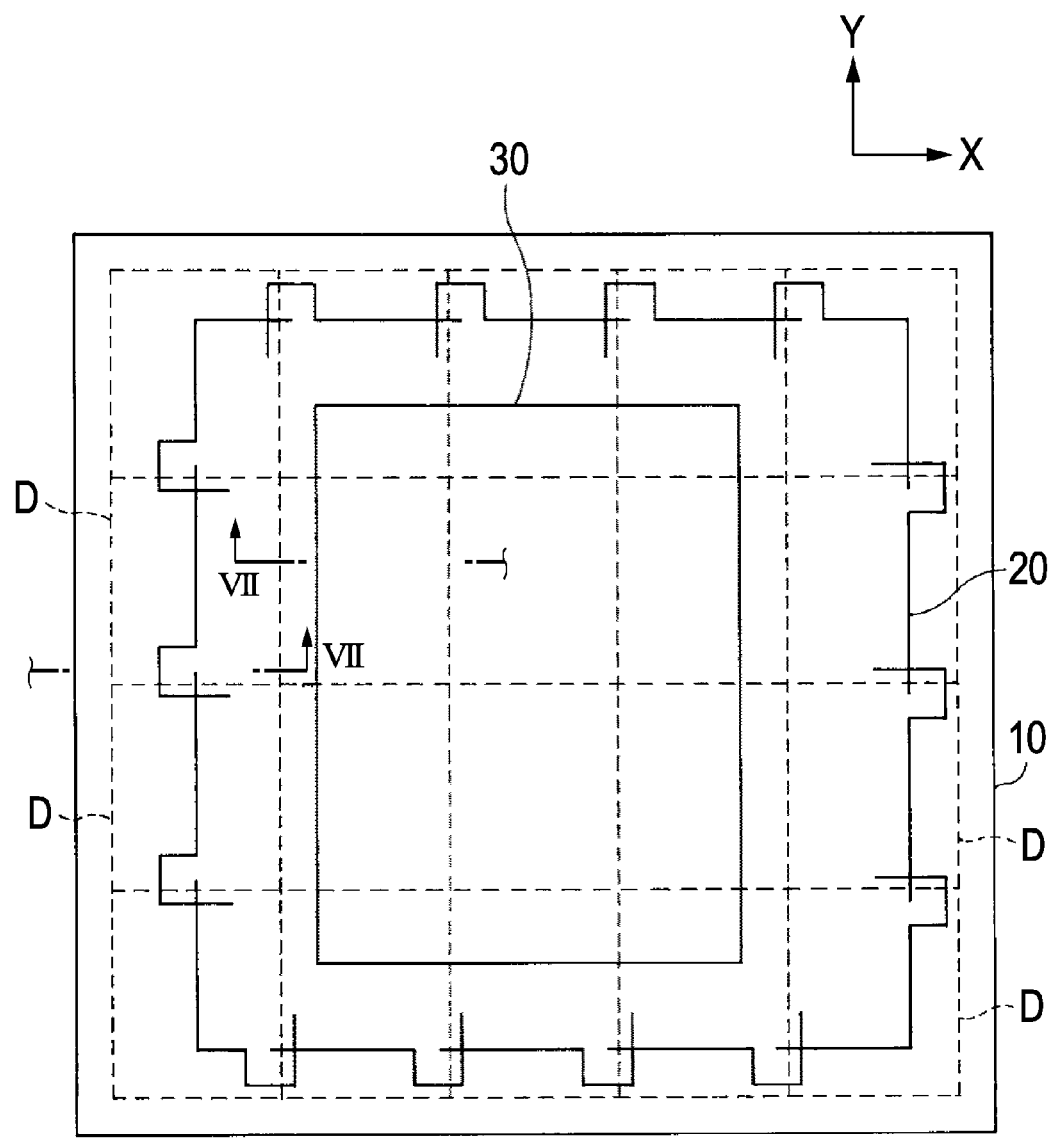
FIG. 6 is a plan view illustrating a configuration of a semiconductor device disclosed in this specification.
Figure 7:
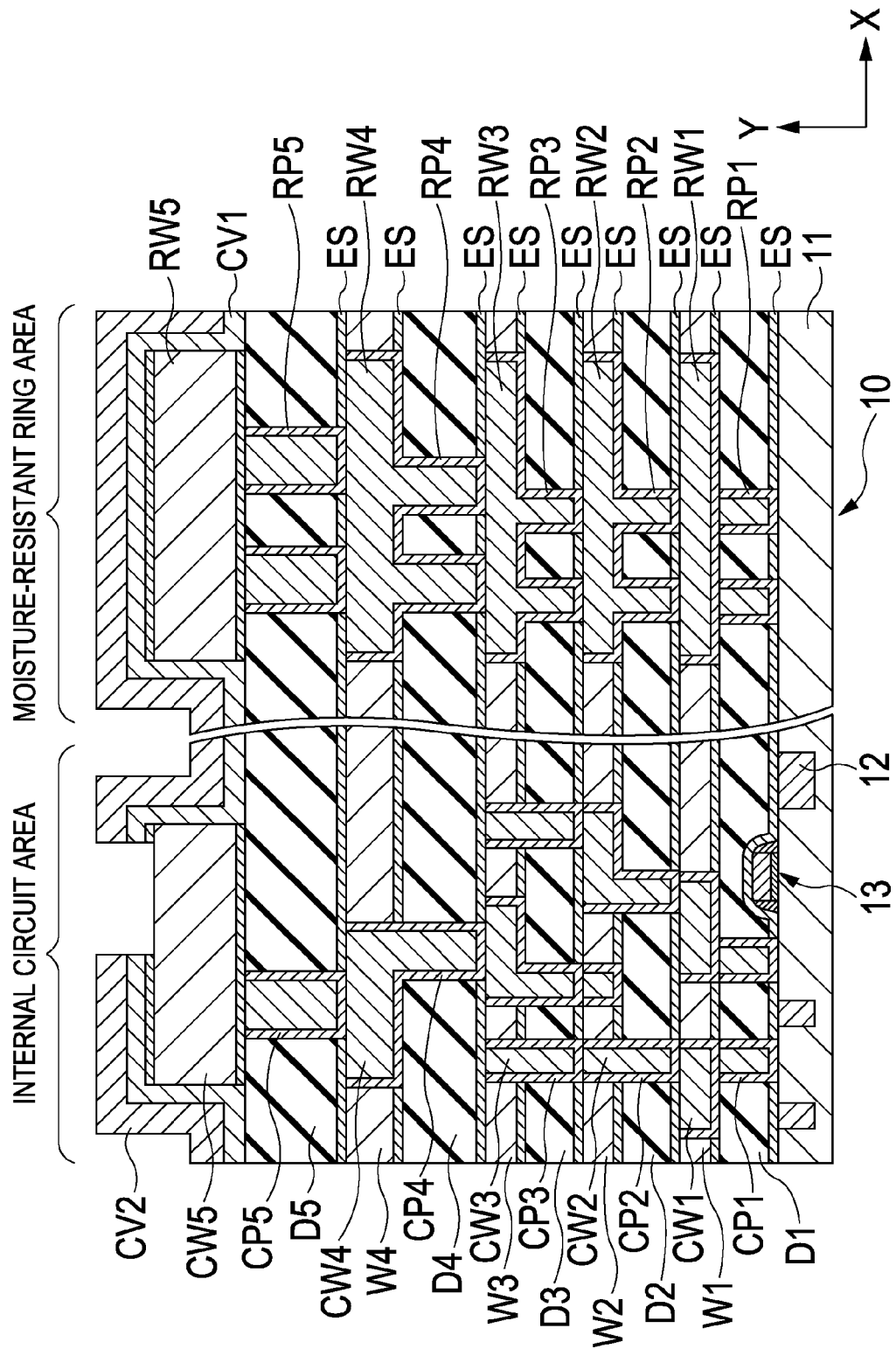
FIG. 7 is a cross-sectional view taken along the lines VII in FIG. 6.
Figure 8:
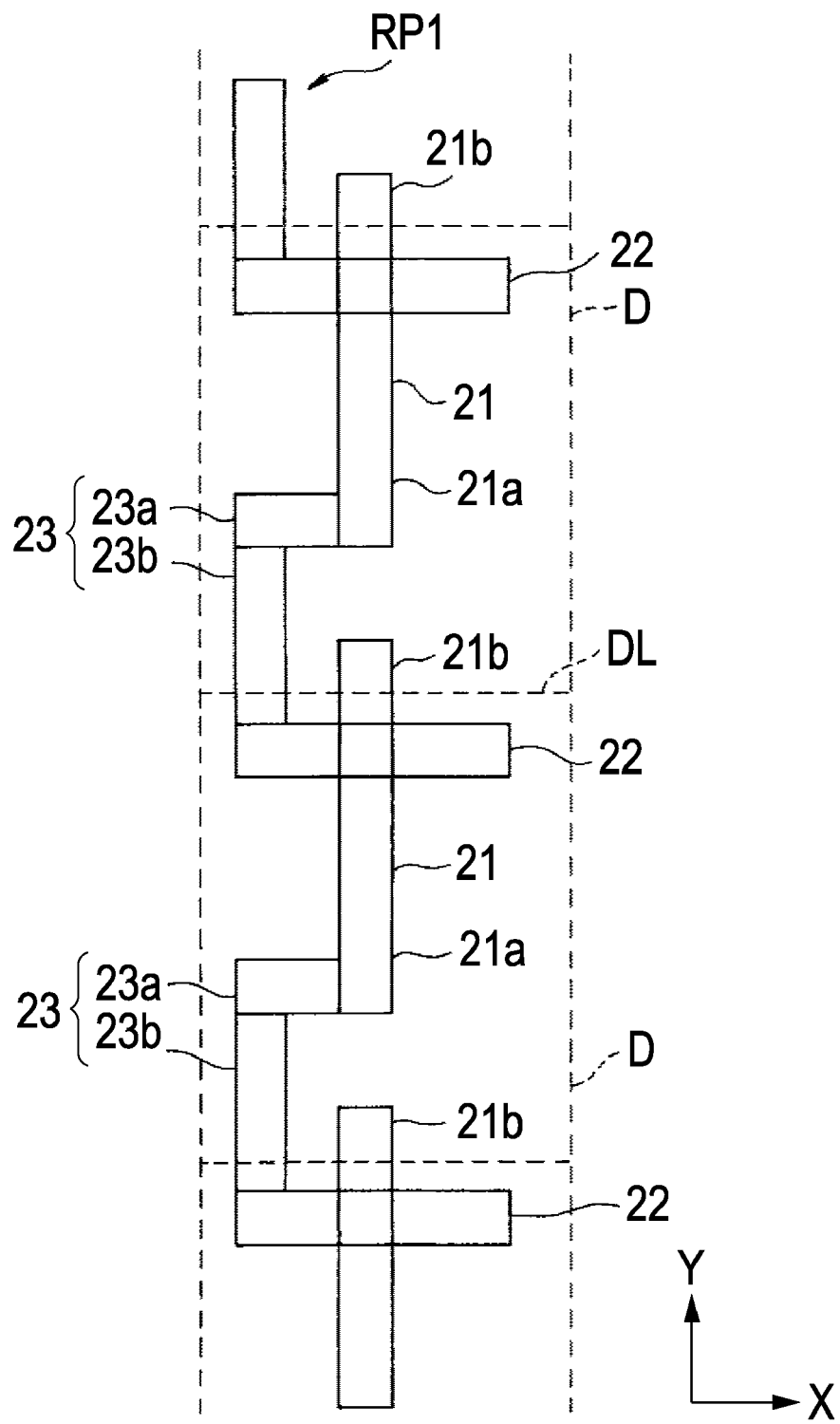
FIG. 8 is a plan view illustrating a plug portion of a moisture-resistant ring in the semiconductor device in FIG. 6 in an enlarged scale.
Figure 9:
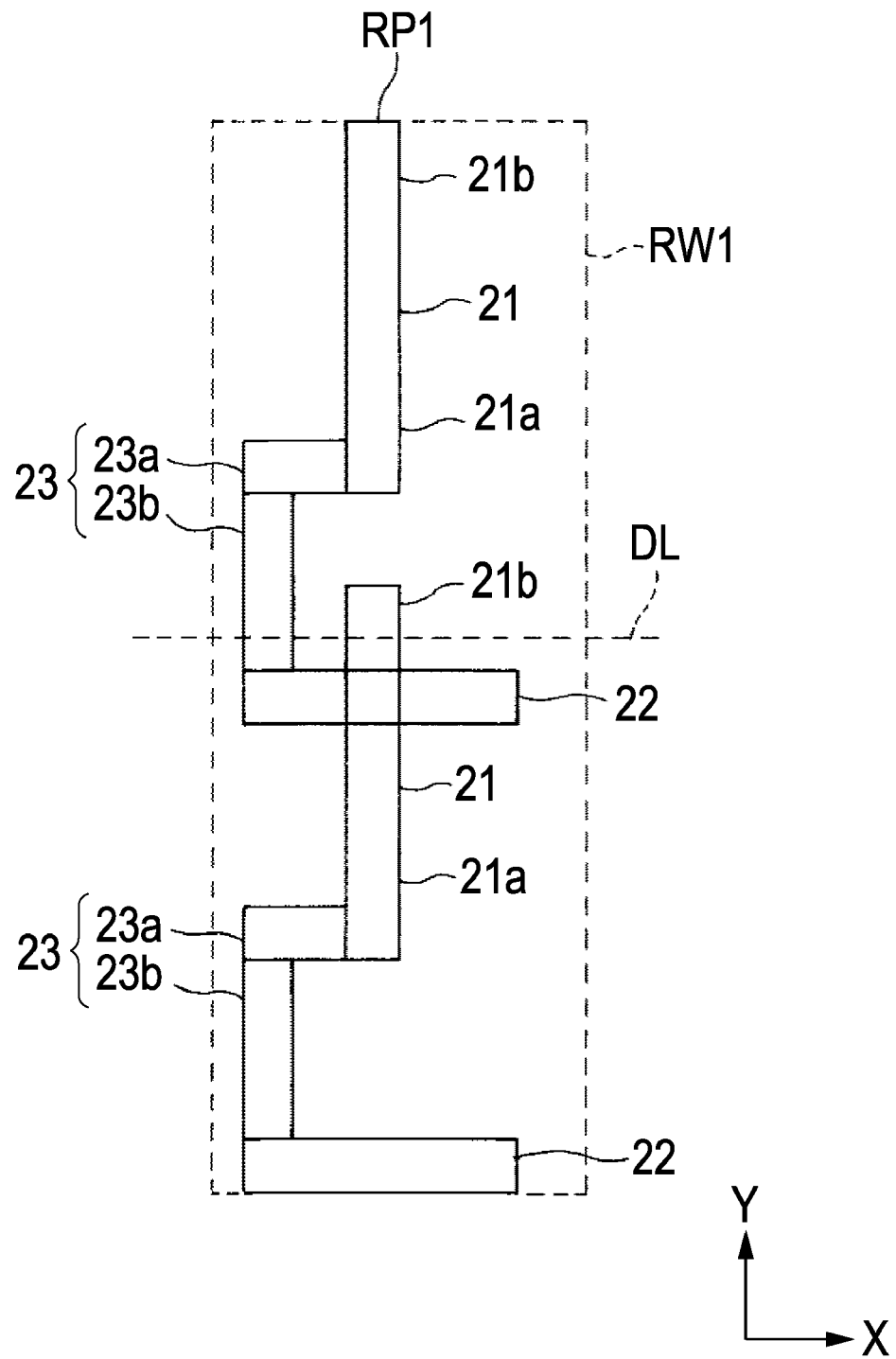
FIG. 9 is a plan view illustrating the plug portion of the moisture-resistant ring in FIG. 6 and a wiring portion adjacent to the plug portion.

FIG. 6 is a plan view illustrating a configuration of the semiconductor device disclosed in this specification. FIG. 7 is a cross-sectional view taken along the lines VII in FIG. 6. FIG. 8 is a plan view of a plug portion of a moisture-resistant ring in the semiconductor device in FIG. 6 in an enlarged scale. FIG. 9 is a plan view illustrating the plug portion of the moisture-resistant ring and a wiring portion adjacent to the plug portion in FIG. 6.

As illustrated in FIG. 6, a semiconductor device 10 includes an internal circuit 30 having a circuit element arranged therein. Also, the semiconductor device 10 includes an annular moisture-resistant ring 20 surrounding the internal circuit 30 continuously. The moisture-resistant ring 20 prevents moisture from entering the internal circuit 30 from the outside of the semiconductor device 10.

The semiconductor device 10 has a large dimension since a large number of circuit elements are provided. Therefore, the dimension of the semiconductor device 10 is larger than the surface area of an exposed portion defined with a mask for forming a circuit pattern by exposure. The semiconductor device 10 is divided into a plurality of divided areas D as illustrated in FIG. 6, so that exposure with the mask is performed for each divided area, so that the entire circuit is exposed.

The divided areas D are areas defined by dividing the semiconductor device 10 into segments of exposure of the semiconductor device 10 for the convenience of design. Exposure with the mask is performed for each of the divided areas D. Although the divided areas D do not exist on the manufactured semiconductor device 10, the divided areas D are illustrated by broken lines for explanation.

As illustrated in FIG. 7, the semiconductor device 10 includes a plurality of insulating layers D1 to D5 and wiring layers W1 to W4 arranged between the insulating layers on a silicon substrate 11. Arranged between the respective wiring layers and the respective insulating layers are etching stopper layers ES used as etching stoppers in the process of manufacturing the semiconductor device 10.

In FIG. 7, a moisture-resistant ring area including a moisture-resistant ring 20 in the semiconductor device 10 is illustrated as a cross-sectional view taken along the line VII in FIG. 6. The moisture-resistant ring 20 includes plug portions RP1 to RP5 formed in the insulating layers D1 to D5, wiring portions RW1 to RW4 formed in the wiring layers W1 to W4 and connected to the adjacent plug portions, and a wiring portion RW5 connected to the plug portion RP5.

As illustrated in FIG. 7, the moisture-resistant ring 20 includes a laminated structure in which the plug portions and the wiring portions are continued on the silicon substrate 11 as a monocrystalline semiconductor, and forms a wall for preventing entry of the moisture across the direction of the depth of the semiconductor device 10.

The wiring portion RW5 at an uppermost layer of the moisture-resistant ring 20 is covered by a first protecting layer CV1 formed of $SiO_2$ or the like and a second protecting layer CV2 for covering the first protecting layer CV1. The first protecting layer CV1 and the second protecting layer CV2—are formed from the moisture-resistant ring area to an internal circuit area so as to cover the entire surface of the semiconductor device 10, and prevent entry of the moisture into the internal circuit 30 in cooperation with the moisture-resistant ring 20.

The moisture-resistant ring 20 illustrated in FIG. 6 specifically has a shape of the annular plug portion RP1 in plan view. Other plug portions RP2 to RP5 of the moisture-resistant ring 20 have the same shape as the plug portion RP1. The shape of the wiring portion of the moisture-resistant ring 20 in plan view will be described later.

In FIG. 7, the internal circuit area including the internal circuit 30 in the semiconductor device 10 is illustrated as a cross-sectional view taken along the line VII in FIG. 6. A transistor 13 is arranged on an element area defined by an element separating structure 12 on the silicon substrate 11.

The internal circuit area of the semiconductor device 10 includes plug portions CP1 to CP5 formed in the insulating layers D1 to D5, wiring portions CW1 to CW4 formed in the wiring layers W1 to W4 and connected to the adjacent plug portions, and CW5 connected to the plug portion CP5 on the silicon substrate 11. The plug portion CP1 connects a source/drain area of the transistor 13 with the wiring portion CW1 on an upper layer. Although it is not illustrated, an upper surface portion of a gate electrode of the transistor 13 is connected to the wiring portion on the upper layer by the plug portion.

An opening for connecting a wiring from the outside is provided on the wiring portion CW5 which is an uppermost layer of the internal circuit area.

The respective plug portions of the moisture-resistant ring 20 and the plug portions of the internal circuit 30 arranged in the same insulating layer as the respective plug portions are formed simultaneously. The plug portions RP1 to RP5 of the moisture-resistant ring 20 are formed of the same conductors as those of the plug portions CP1 to CP5 of the internal circuit 30 formed simultaneously.

In the same manner, the respective wiring portions of the moisture-resistant ring 20 are formed simultaneously with the wiring portions of the internal circuit 30 arranged in the same wiring layer as the respective wiring portions. The wiring portions RW1 to RW5 of the moisture-resistant ring 20 are formed of the same conductors as those of the wiring portions CW1 to CW5 of the internal circuit 30 formed simultaneously.

Therefore, the moisture-resistant ring 20 is formed of the conductor as a whole, and has the same potential as a whole. The potential of the moisture-resistant ring 20 may be a ground potential of the semiconductor device 10.

A plan view illustrating part of the plug portion RP1 of the moisture-resistant ring 20 is illustrated in FIG. 8. In FIG. 8, a portion of the plug portion RP1 arranged in the two divided areas D and a portion of the plug portion RP1 adjacent to these divided areas. The adjacent two divided areas D are divided by the dividing line DL.

As illustrated in FIG. 8, the plug portion RP1 has an extending portion 21 extending linearly in a Y-direction. Also, the plug portion RP1 includes a vertical portion 22 orthogonal to a first extending portion 21a and extending in an X-direction. The extending portion 21 includes the first extending portion 21a extending linearly in the Y-direction at one end portion thereof, and a second extending portion 21b orthogonal to the vertical portion 22 and extending linearly in the X-direction at the other end portion.

The first extending portion 21a and the second extending portion 21b extending from the adjacent divided area beyond the dividing line DL are apart from each other. The second extending portion 21b extending from the adjacent divided area is arranged on an extension line of the first extending portion 21a.

When forming the plug portion RP1 of the moisture-resistant ring 20 by exposure, an exposure process (first exposure process) for forming the first extending portion 21a and an exposure process (second exposure process) for forming the second extending portion 21b extending from the adjacent divided area beyond the dividing line DL are different. Here, an amount of displacement of a position of the mask layer where a first extending portion pattern is actually formed by exposure with respect to a position of the mask layer on the silicon substrate 11 where the first extending portion pattern which forms the first extending portion 21a may be formed by exposure by the first exposure process is expressed as D1.

Also, an amount of displacement of a position where a second extending portion pattern is actually formed on the mask layer by exposure with respect to a position where the second extending portion pattern which forms the second extending portion 21b may be formed on the mask layer by exposure by the second exposure process is expressed as D2. A design amount of separation between the first extending portion 21a and the second extending portion 21b extending from the adjacent divided area beyond the dividing line DL is preferably set to a value larger than the sum of D1 and D2.

In this manner, by performing the exposure of the plug portion RP1, even when the position of the mask layer where a mask pattern is formed by exposure is displaced, the first extending portion 21a of the plug portion RP1 and the second extending portion 21b extending from the adjacent divided area beyond the dividing line DL may reliably be positioned apart from each other.

Also, as illustrated in FIG. 8, the first extending portion 21a and the vertical portion 22 are apart from each other, and the plug portion RP1 has a joint portion 23 which connects the first extending portion 21a and the vertical portion 22. The joint portion 23 includes a first connecting portion 23a bent vertically with respect to the first extending portion 21a and a second connecting portion 23b bent vertically with respect to the first connecting portion 23a and connected to the vertical portion 22.

The plug portion RP1 includes the extending portion 21 having the first extending portion 21a and the second extending portion 21b, the joint portion 23 having the first connecting portion 23a and the second connecting portion 23b, and the vertical portion 22 as a basic structure. The first extending portion 21a and the second extending portion 21b have the same width. The first connecting portion 23a and the second connecting portion 23b have the same width. The extending portion 21, the joint portion 23, and the vertical portion 22 have the same width.

The extending portion 21 having the first extending portion 21a and the second extending portion 21b, the joint portion 23 having the first connecting portion 23a and the second connecting portion 23b, and the vertical portion 22 are formed in the same insulating layer D1. The plug portion RW1 is connected to the silicon substrate 11 in the lower layer and the wiring portion RW1 in the upper layer.

As illustrated in FIG. 7 and FIG. 8, the plug portion RP1 of the moisture-resistant ring 20 is formed by embedding the conductor in the groove-shaped via. The extending portion 21 having the first extending portion 21a and the second extending portion 21b preferably has the depth and the width in a case of cutting along a plane orthogonal to the longitudinal direction thereof which are the same as the depth and the width of the plug portion CP1 formed in the same insulating layer D1 in the internal circuit 30. In the same manner, the vertical portion 22, and the joint portion 23 having the first connecting portion 23a and the second connecting portion 23b preferably have the depth and the width in a case of cutting along a plane orthogonal to the longitudinal direction thereof which are the same as the depth and the width of the plug portion CP1 formed in the same insulating layer D1 in the internal circuit 30.

Here, the depth of the plug portion CP1 indicates a dimension in the Y-direction in FIG. 7, and the width of the plug portion CP1 indicates a dimension in the X-direction in FIG. 7.

The depth of the plug portion CP1 of the internal circuit 30 is preferably in a range from 0.35 μm to 1.0 μm. Also, the width of the plug portion CP1 of the internal circuit 30 is preferably in a range from 0.08 μm to 0.9 μm.

When the depth or the width of the plug portion CP1 exceeds an upper limit value of the range described above, defective shape may occur, or defective embedding of the conductor into the via hole may occur when forming the via hole which forms the plug portion.

In the same manner, as regards other plug portions RP2 to RP5 of the moisture-resistant ring 20, it is preferable to have the same depth and the width as the plug portions CP2 to CP5 formed in the same insulating layer D1 in the internal circuit 30.

A lower limit value of the depth or the width of the plug portion CP1 is limited by a microprocessing technology used for manufacturing the semiconductor device 10.

In FIG. 9, a shape of a part of the wiring portion RW1 of the moisture-resistant ring 20 formed in the wiring layer W1 in plan view is illustrated by a broken line together with the plug portion RP1. As illustrated in FIG. 7, the wiring portion RW1 is arranged in the wiring layer W1 laminated on the insulating layer D1 in which the plug portion RP1 is formed. The wiring portion RW1 is connected to the plug portion RP1 arranged on the lower layer and the plug portion RP2 arranged on the upper layer.

As illustrated in FIG. 9, the wiring portion RW1 is formed into a band shape in the Y-direction so as to cover the first extending portions 21a, the vertical portions 22, the joint portions 23, and the second extending portions 21b extending from the adjacent divided area. A shape of the entire wiring portion RW1 in plan view has an annular shape so as to cover the moisture-resistant ring 20 illustrated in FIG. 6, although not illustrated. Although not illustrated, in FIG. 6, a portion of the wiring portion RW1 covering the portion of the plug portion RP1 extending in the X-direction is formed into a band shape in the X-direction.

Other wiring portions RW2 to RW5 of the moisture-resistant ring 20 have the same shape as the wiring portion RW1.

According to the semiconductor device 10 described above, when forming the moisture-resistant ring extending across the divided areas by exposure with the plurality of masks, the semiconductor device 10 may be provided with the continued moisture-resistant ring 20 even when the positions of exposure of the mask patterns on the mask layer are displaced.

According to the semiconductor device 10 described above, since the vertical portion 22 and the second extending portion 21b extending from the adjacent divided area beyond the dividing line DL extend orthogonally to each other, the width of a portion where the vertical portion 22 and the second extending portion 21b are overlapped with each other is the same as the width of other portions of the plug portion. Therefore, the semiconductor device 10 has no wide plug portion, and hence the defective formation of the groove-shaped via and the defective embedding of the conductor which forms the plug portion of the moisture-resistant ring 20 do not occur.

In addition, according to the semiconductor device 10 described above, since the first extending portion 21a and the second extending portion 21b extending from the adjacent divided area beyond the dividing line DL do not overlap with each other, the semiconductor device 10 does not have the defective formation of the groove-shaped via and the defective embedding of the conductor which forms the plug portion of the moisture-resistant ring 20.

Subsequently, a modification of the moisture-resistant ring 20 described above will be described below with reference to FIGS. 10 to 15.

Figure 10:
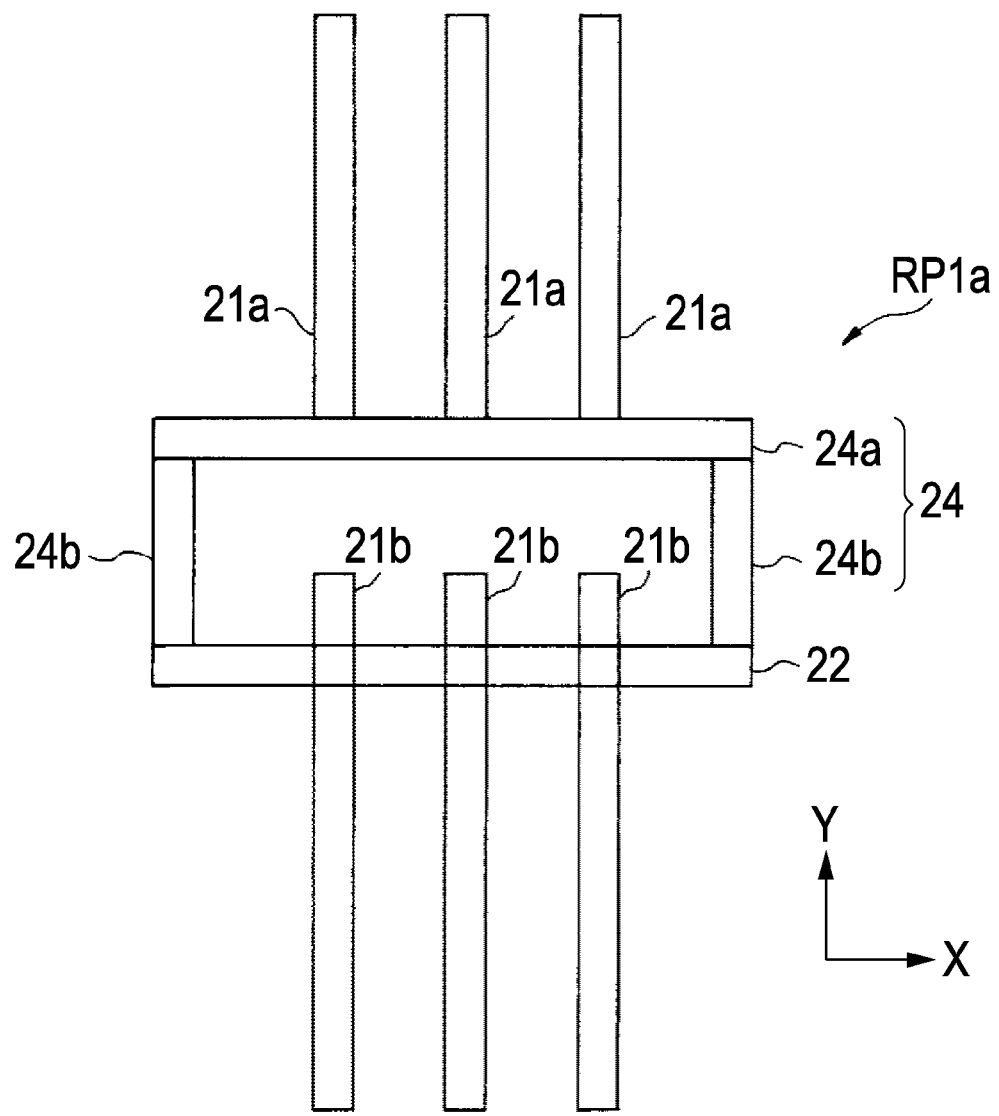
FIG. 10 is a drawing illustrating a modification 1 of the moisture-resistant ring.

FIG. 10 is a drawing illustrating a modification 1 of the moisture-resistant ring 20.

As illustrated in FIG. 10, a plug portion RP1a in the modification 1 of the moisture-resistant ring 20 is different from the plug portion RP1 described above, and includes three first extending portions 21a and three second extending portions 21b. The three first extending portions 21a are arranged equidistantly in the X-direction in parallel. Also, the three second extending portions 21b are arranged equidistantly in the X-direction in parallel.

The plug portion RP1a includes a joint portion 24 which connects the first extending portions 21a and the vertical portion 22, and the joint portion 24 forms a closed loop in cooperation with the vertical portion 22.

The joint portion 24 includes a second vertical portion 24a having the same length as the vertical portion 22, being opposed the vertical portion 22 at a distance and being connected to the first extending portions 21a, and a pair of connecting portions 24b which connect opposing end portions of the vertical portion 22 and the second vertical portion 24a.

The second vertical portion 24a extends linearly in the X-direction. The pair of connecting portions 24b extend respectively in the Y-direction.

The three first extending portions 21a extend respectively vertically from the second vertical portion 24a. The three second extending portions 21b extend respectively orthogonally to the vertical portion 22.

As illustrated in FIG. 10, the second extending portions 21b and the second vertical portion 24a are positioned apart from each other.

When forming the plug portion RP1a of the moisture-resistant ring 20 by exposure, an exposure process (first exposure process) for forming the second vertical portion 24a together with the first extending portions 21a and an exposure process (second exposure process) for forming the second extending portions 21b are different. Here, an amount of displacement of a position where a second vertical portion pattern is actually formed on the mask layer by exposure with respect to a position where the second vertical portion pattern which forms the second vertical portion 24a may be formed on the mask layer on the silicon substrate 11 by exposure by the first exposure process is expressed as D3. Also, an amount of displacement of a position where the second extending portion pattern is actually formed on the mask layer by exposure with respect to a position on the mask layer where the second extending portion pattern which forms the second extending portion 21b may be formed on the mask layer by exposure by the second exposure process is expressed as D4. A design amount of separation between the second vertical portion 24a and the second extending portions 21b extending from the adjacent divided area beyond the dividing line DL is preferably set to a value larger than the sum of D3 and D4.

In this manner, by performing exposure of the plug portion RP1a, even when the position where the mask pattern is formed on the mask layer by exposure is displaced, the second vertical portion 24a of the plug portion RP1a and the second extending portions 21b extending from the adjacent divided area beyond the dividing line DL may reliably be positioned apart from each other.

According to the moisture-resistant ring 20 described above, the plug portion RP1a includes the three first extending portions 21a and the three second extending portions 21b, and the three first extending portions 21a and the three second extending portions 21b are connected via the closed loop structure, and hence the structure of the moisture-resistant ring 20 is further rigid.

Also, according to the moisture-resistant ring 20 described above, since the second vertical portion 24a and the second extending portions 21b extending from the adjacent divided area beyond the dividing line DL do not overlap with each other, the semiconductor device 10 does not have the defective formation of the groove-shaped via and the defective embedding of the conductor which forms the plug portion of the moisture-resistant ring 20.

Figure 11:
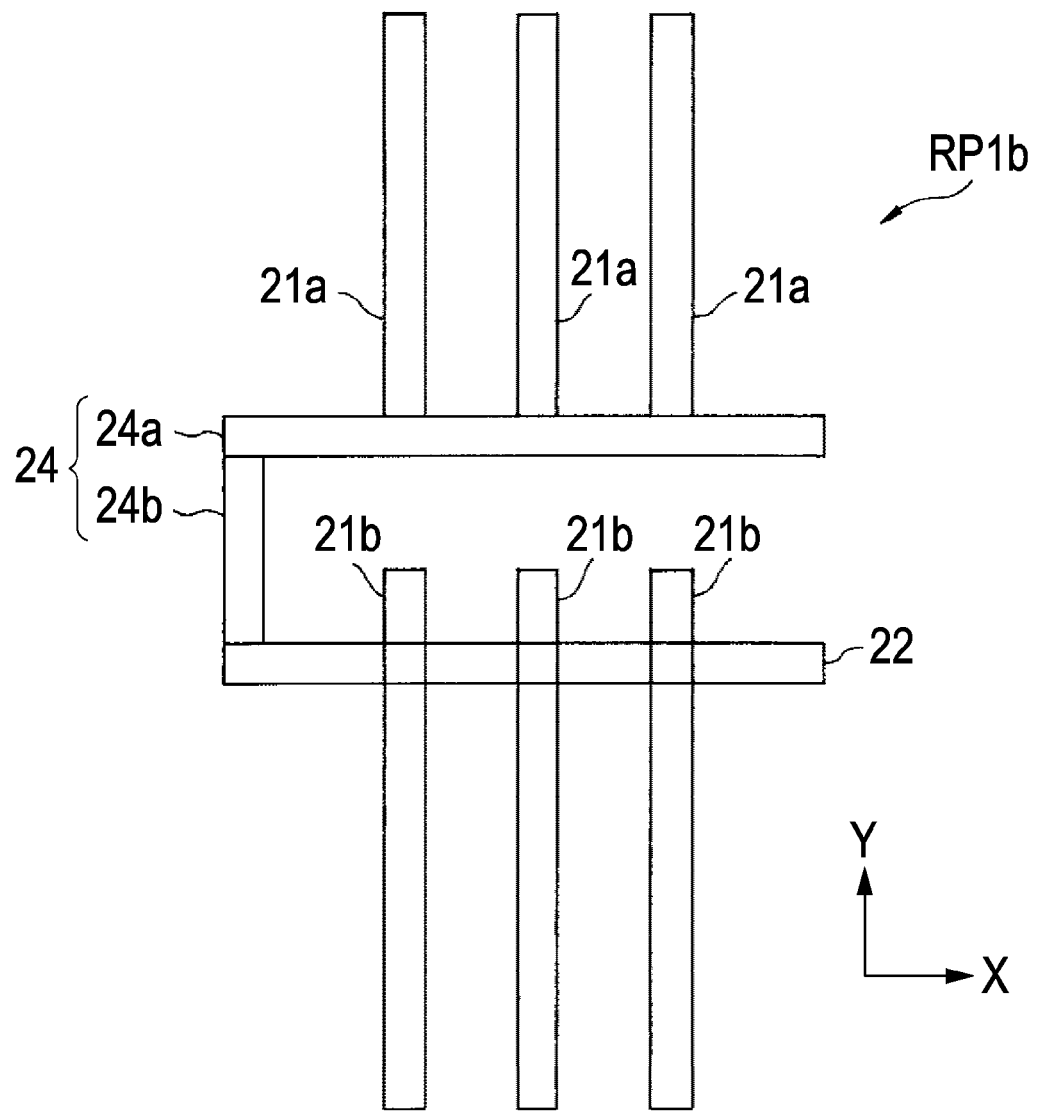
FIG. 11 is a drawing illustrating a modification 2 of the moisture-resistant ring.

FIG. 11 is a drawing illustrating a modification 2 of the moisture-resistant ring 20.

In a plug portion RP1b in the modification 2 of the moisture-resistant ring 20, the single connecting portion 24b is removed from the closed loop structure in contrast to the plug portion RP1a illustrated in FIG. 10.

Figure 12:
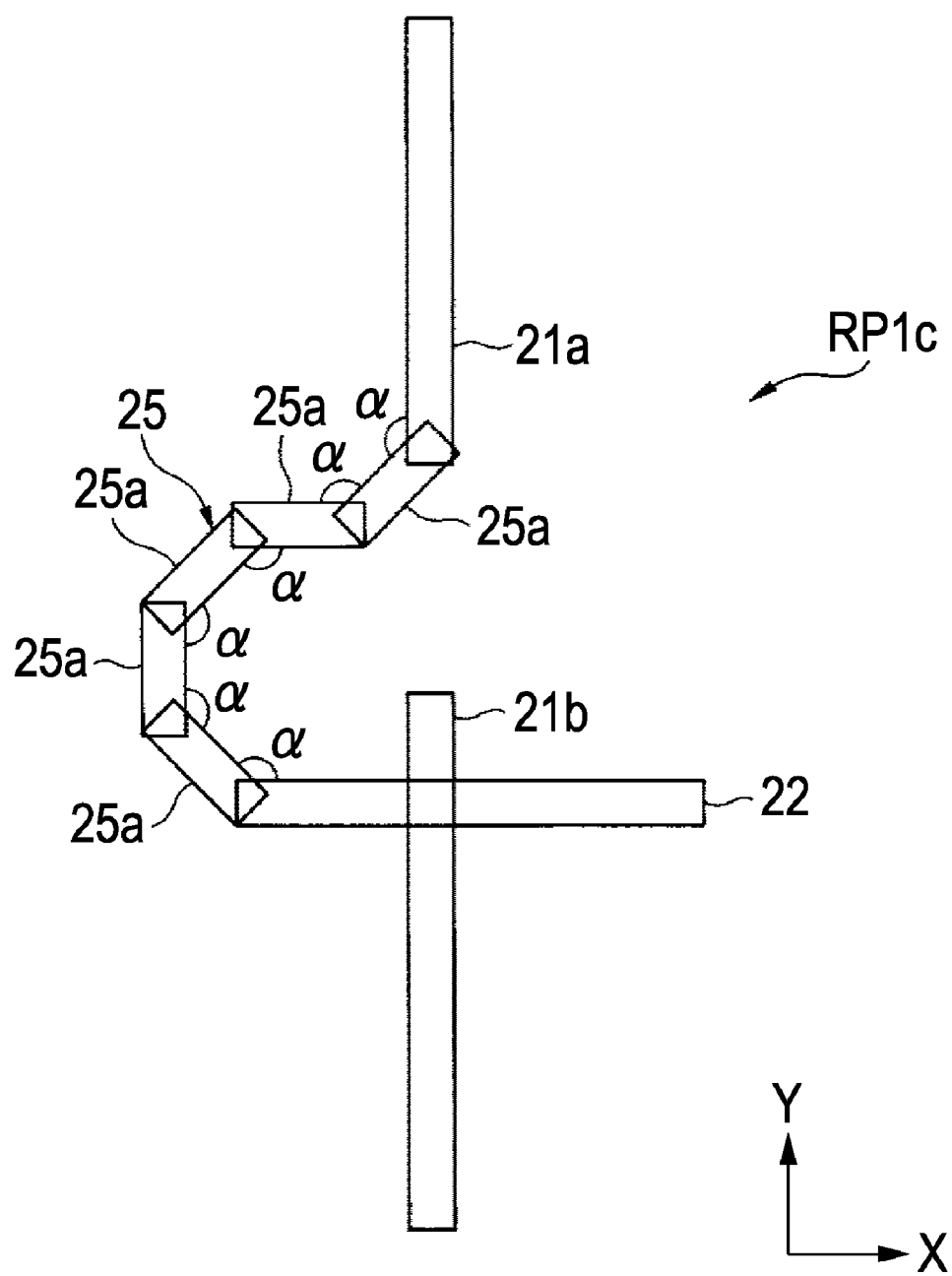
FIG. 12 is a drawing illustrating a modification 3 of the moisture-resistant ring.

FIG. 12 is a drawing illustrating a plug portion RP1c as a modification 3 of the plug portion RP1 of the moisture-resistant ring 20.

As illustrated in FIG. 12, the plug portion RP1c has a joint portion 25 which connects the first extending portion 21a and the vertical portion 22. The joint portion 25 includes a plurality of linear connecting portions 25a, and the respective connecting portions 25a are connected while forming an obtuse angle α by end portions thereof in contrast to the plug portion RP1 illustrated in FIG. 8. Also, the connecting portion 25a connected to the first extending portion 21a is connected to the first extending portion 21a while forming the obtuse angle α. In addition, the connecting portion 25a connected to the vertical portion 22 is connected to the vertical portion 22 while forming the obtuse angle α.

At the plug portion RP1c, an angle of 135 degrees are used as the obtuse angle α. The value of the obtuse angle α may be other values.

According to the moisture-resistant ring 20 described above, since the first extending portion 21a and the vertical portion 22 of the plug portion RP1c are connected via the joint portion 25 having the obtuse angles α, defective embedding of the conductor or generation of cracks at a joint portion is prevented.

Figure 13:
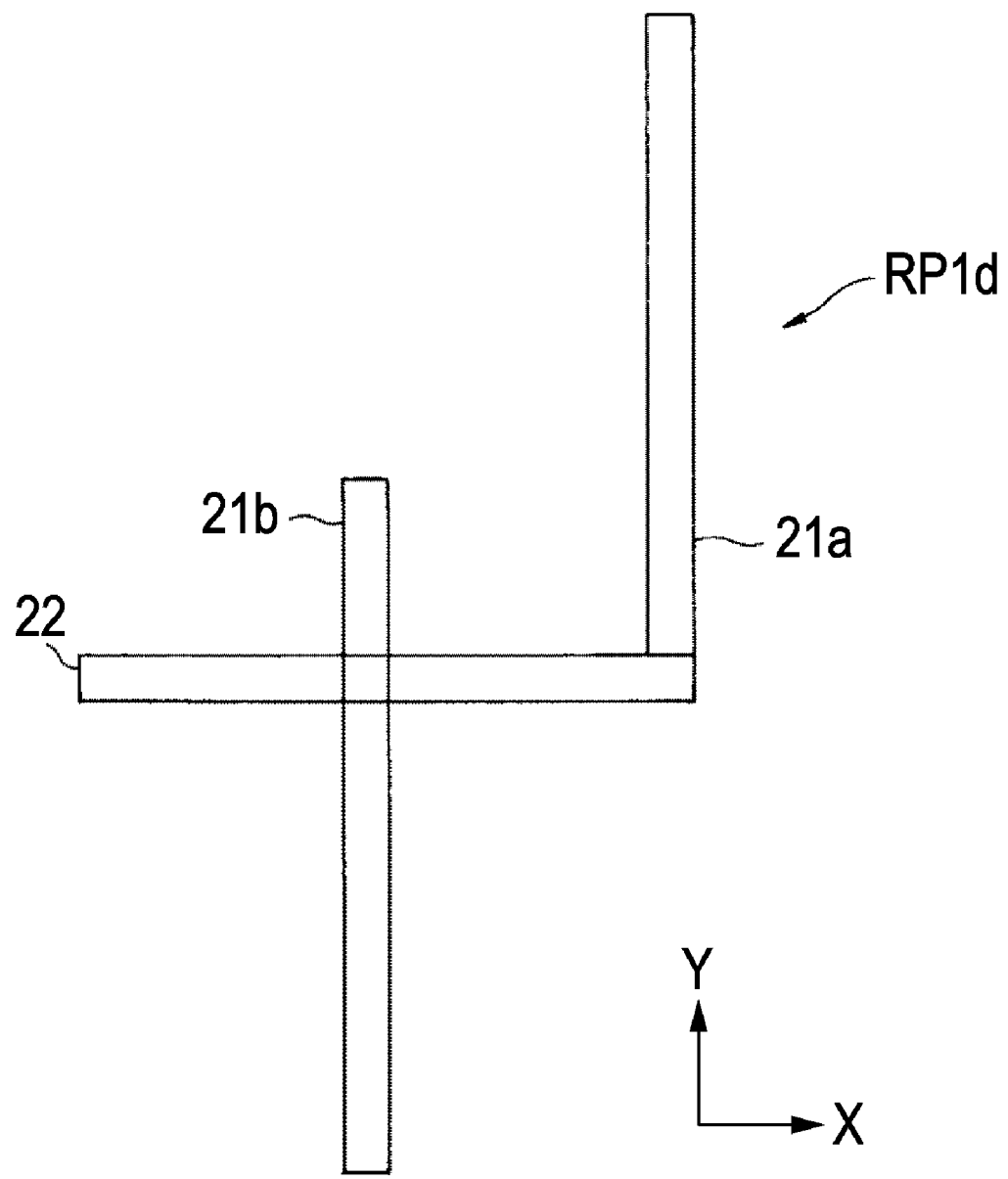
FIG. 13 is a drawing illustrating a modification 4 of the moisture-resistant ring.

FIG. 13 is a drawing illustrating a modification 4 of the moisture-resistant ring 20.

As illustrated in FIG. 13, a plug portion RP1d in the modification 3 of the moisture-resistant ring 20 does not have the joint portion in contrast to the plug portion RP1 illustrated in FIG. 8, and the first extending portion 21a and the vertical portion 22 are connected directly.

In the plug portion RP1d, the second extending portion 21b is not arranged on the extension line of the first extending portion 21a.

According to the moisture-resistant ring 20 described above, since the structure of the plug portion RP1d is simple, fabrication of the mask pattern of the moisture-resistant ring 20 is facilitated.

Figure 14:
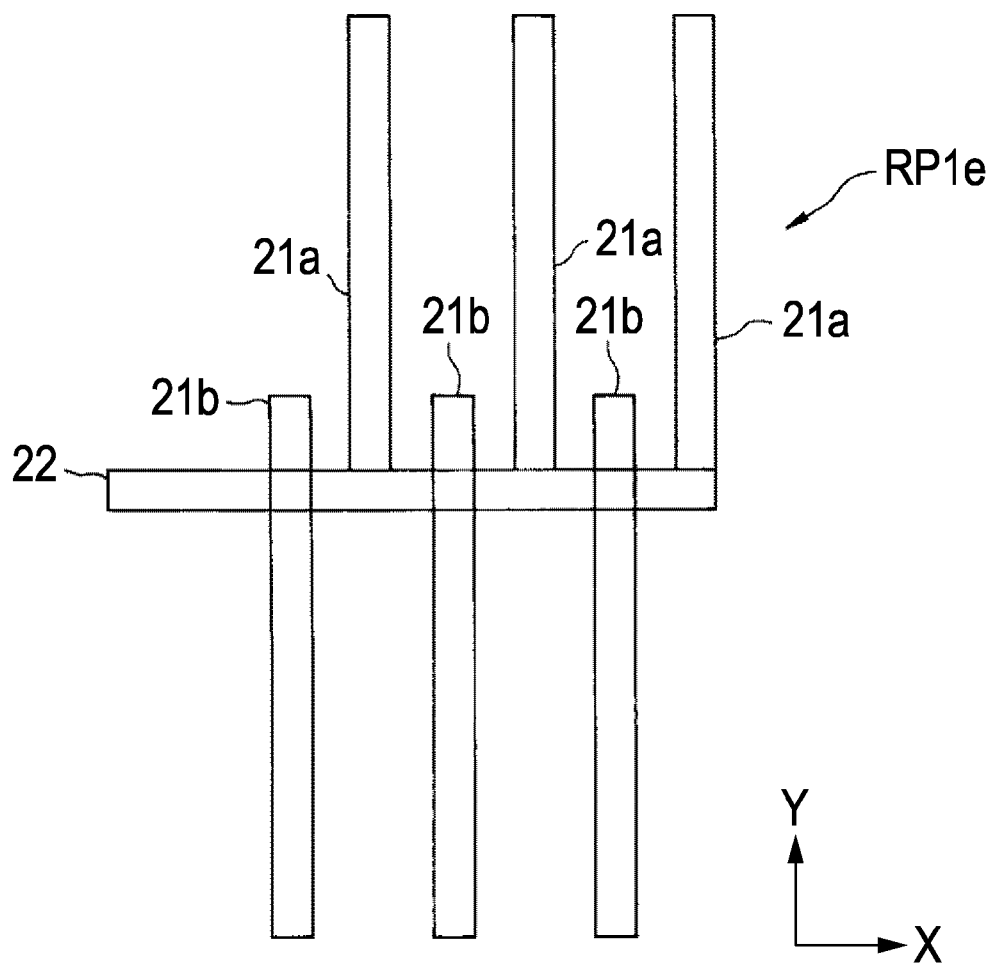
FIG. 14 is a drawing illustrating a modification 5 of the moisture-resistant ring.

FIG. 14 is a drawing illustrating a modification 5 of the moisture-resistant ring 20.

As illustrated in FIG. 14, a plug portion RP1e in the modification 5 of the moisture-resistant ring 20 is different from the plug portion RP1c illustrated in FIG. 13, and includes three first extending portions 21a and three second extending portions 21b. The three first extending portions 21a are arranged equidistantly in the X-direction in parallel. Also, the three second extending portions 22b are arranged equidistantly in the X-direction in parallel.

Although the distance between the first extending portions 21a and the distance between the second extending portions 21b are the same, the first extending portions 21a are arranged so as to be displaced from the second extending portions 21b by half a pitch in the X-direction.

The three first extending portions 21a respectively extend from the vertical portion 22 in the vertical direction. The three second extending portions 21b extend respectively orthogonally to the vertical portion 22.

According to the moisture-resistant ring 20 described above, the structure is further rigid in comparison with the plug portion RP1c illustrated in FIG. 13.

Figure 15:
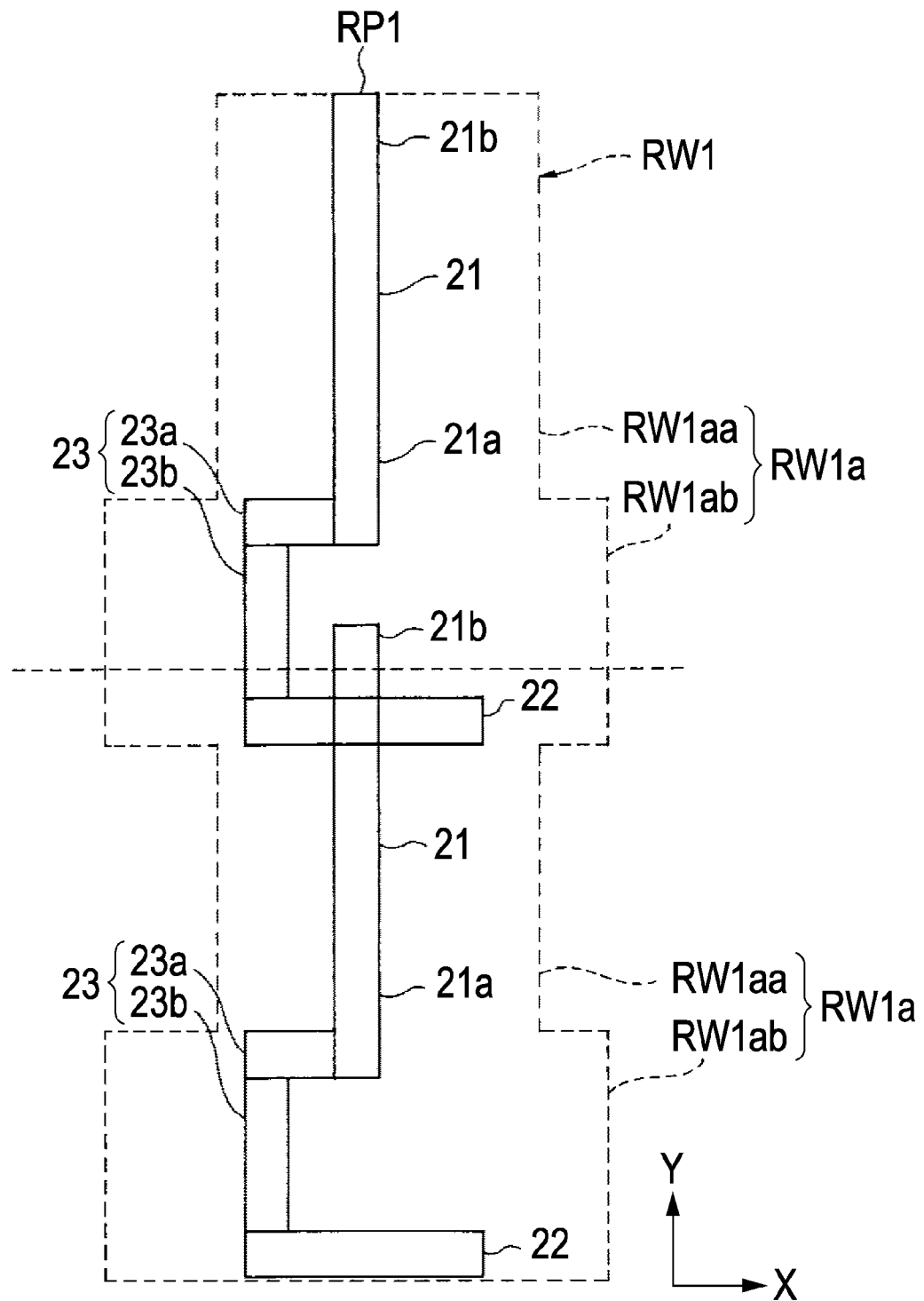
FIG. 15 is a drawing illustrating a modification 6 of the moisture-resistant ring.

FIG. 15 is a drawing illustrating a modification 6 of the moisture-resistant ring 20.

As illustrated in FIG. 15, a wiring portion RW1a in the modification 5 of the moisture-resistant ring 20 has a portion RW1ab which covers the vertical portion 22 and the joint portion 23 formed to be wider than the other portion RW1aa in contrast to the wiring portion RW1 illustrated in FIG. 9.

Since the vertical portions 22 and the joint portions 23 of the plug portion RP1 are formed to be wider than the extending portions 21 in the X-direction, the wiring portions RW1ab arranged so as to cover the vertical portions 22 and the joint portions 23 are also formed to be wider in the X-direction as in the case of the vertical portions 22 and the joint portions 23.

According to the moisture-resistant ring 20 described above, even when the position of the mask layer where the mask pattern is exposed in a state in which the mask pattern is displaced when manufacturing the semiconductor device 10, the wiring portions RW1a are arranged so as to reliably cover the plug portion PR1.

Subsequently, as regards the semiconductor device 10 described above, an embodiment of a method of manufacturing the semiconductor device disclosed in this specification will be described below with reference to FIG. 16 to FIG. 25.

First of all, as illustrated in FIG. 16A, the element area defined by the element separating structure 12 in the silicon substrate 11 is formed. Subsequently, the transistor 13 is formed on the element area.

Subsequently, as illustrated in FIG. 16B, the etching stopper layer ES is formed on the silicon substrate 11 so as to cover the transistor 13. The etching stopper layer ES is formed using, for example, SiN. The thickness of the etching stopper layer ES may be, for example, 100 nm.

Subsequently, the insulating layer D1 is formed on the etching stopper layer ES. The insulating layer D1 is formed using, for example, $SiO_2$. The thickness of the insulating layer D1 may be, for example, 600 nm. Subsequently, the insulating layer D1 is flattened by being ground using a chemical mechanical polishing method (CMP method). The insulating layer D1 is formed to have a thickness of, for example, 400 nm by this polishing.

Subsequently, a mask layer M1 is formed on the insulating layer D1. The mask layer M1 is formed using, for example, photoresist.

Subsequently, with a mask P1 illustrated in FIG. 17A, part of the groove-shaped via pattern of the plug portion RP1 of the moisture-resistant ring 20 is formed on the mask layer M1 by exposure.

The mask P1 includes an extending portion pattern 21p extending linearly. The extending portion pattern 21p includes a first extending portion pattern 21ap extending linearly at one of end portions thereof, and includes a second extending portion pattern 21bp extending in the direction parallel to the first extending portion pattern 21ap at the other end portion thereof. The mask P1 includes a vertical portion pattern 22p which is apart from the first extending portion pattern 21ap and extending in the direction orthogonal to the first extending portion pattern 21ap.

Figure 17A:
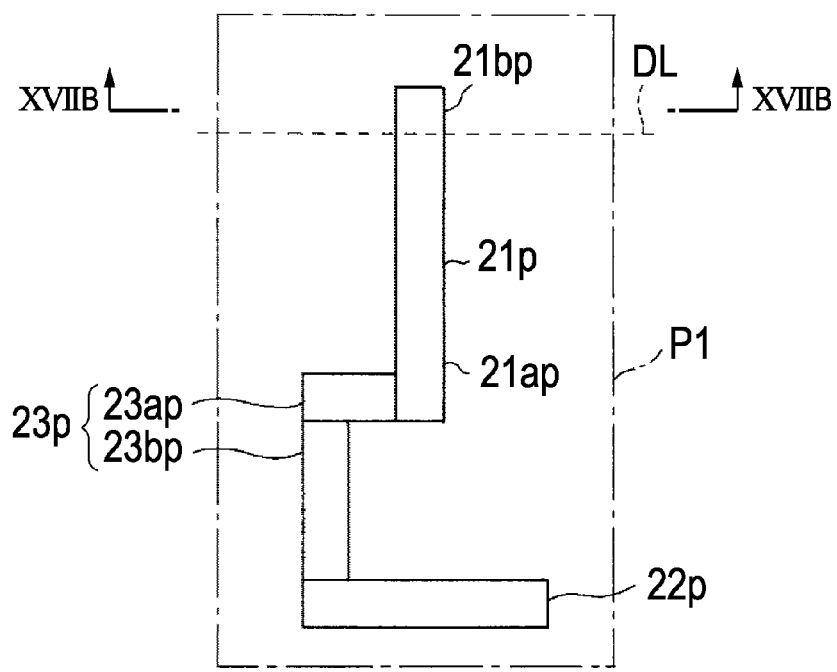
FIGS. 17A and 17B are drawings illustrating a process continuing from FIG. 16.

The mask P1 includes a joint portion pattern 23p which connects the first extending portion pattern 21ap and the vertical portion pattern 22p as illustrated in FIG. 17A. The joint portion pattern 23p includes a first connecting portion pattern 23ap bent vertically with respect to the first extending portion pattern 21*ap* and a second connecting portion pattern 23*bp* bent vertically with respect to the first connecting portion pattern 23*ap* and connected to the vertical portion pattern 22*p*.

The first extending portion pattern 21*ap* and the second extending portion pattern 21*bp* have the same width. The first connecting portion pattern 23*ap* and the second connecting portion pattern 23*bp* have the same width. The extending portion pattern 21*p*, the joint portion pattern 23*p*, and the vertical portion pattern 22*p* have the same width.

Figure 19:
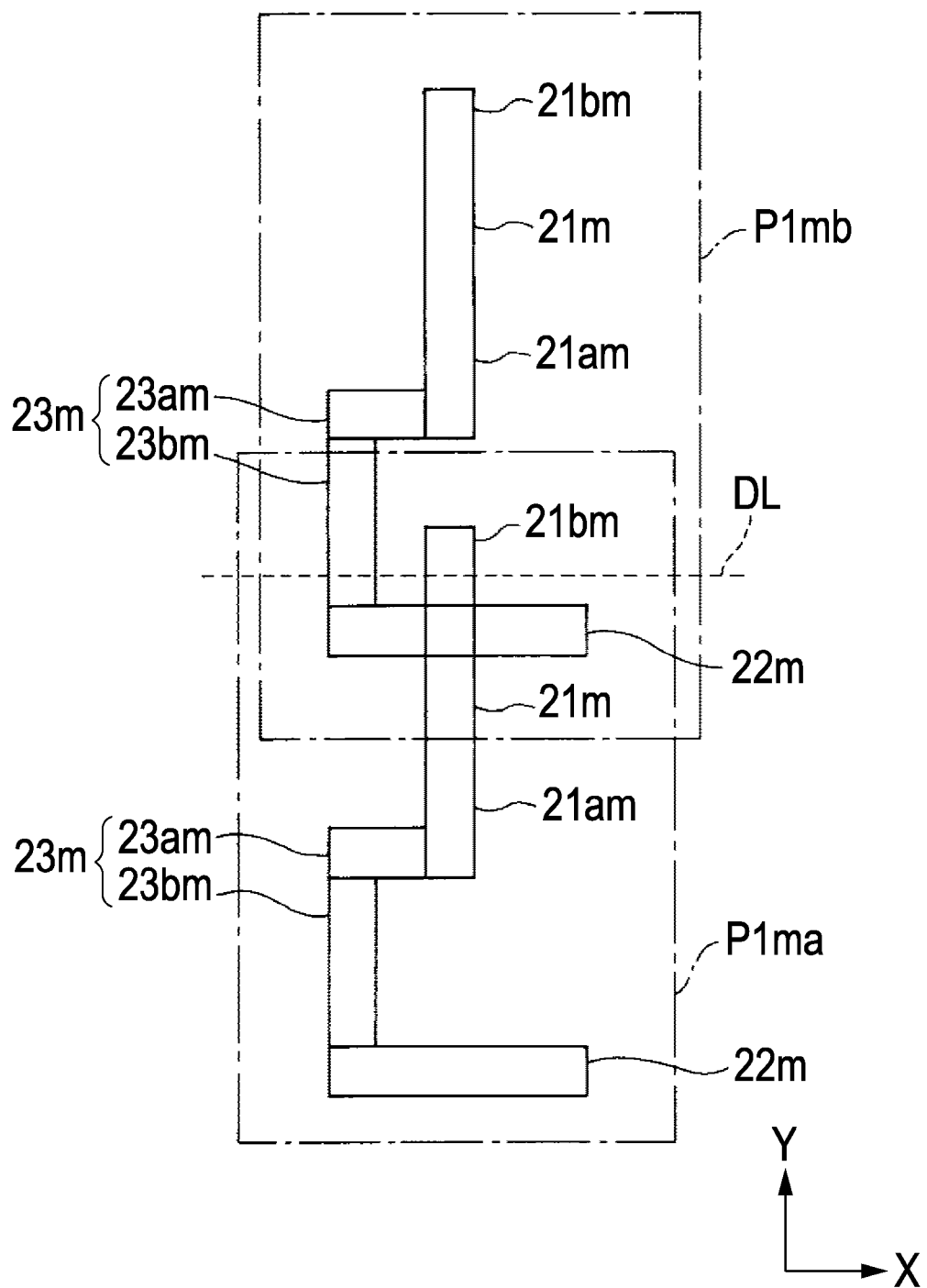
FIG. 19 is a plan view illustrating an exposed portion on a mask layer formed with a plug portion pattern.

An exposed portion Pima formed on the mask layer M1 by exposure for the first time with the mask P1 illustrated in FIG. 17A is illustrated in FIG. 19. Exposed portions 21*m* are formed by the extending portion pattern 21*p*. The exposed portions 21*m* each include an exposed portion 21*am* formed by the first extending portion pattern 21*ap* and an exposed portion 21*bm* formed by the second extending portion pattern 21*bp*. Exposed portions 22*m* are formed by the vertical portion pattern 22*p*. In addition, the exposed portions 23*m* are formed by the joint portion pattern 23*p*. The exposed portions 23*m* each include an exposed portion 23*am* formed by the first connecting portion pattern 23*ap* and an exposed portion 23*bm* formed by the second connecting portion pattern 23*bp*. FIG. 19 also illustrates an exposed portion P1*mb* formed on the mask layer M1 by exposure for the second time with the mask P1.

In FIG. 19, for easy understanding of the description, the positions of the exposed portions P1*ma*, P1*mb* on the mask layer M1 exposed with the mask P1 by the two times of exposure are illustrated to be displaced from each other in the X-direction.

In this exposure, as illustrated in FIG. 19, the exposed portion P1*ma* on the mask layer M1 exposed with the mask P1 is arranged in such a manner that the dividing line DL extends across the exposed portion 21*bm* formed by the second extending portion pattern 21*bp*. The exposed portion P1*ma* on the mask layer M1 exposed with the mask P1 extends to a portion of the adjacent divided area.

Figure 17B:
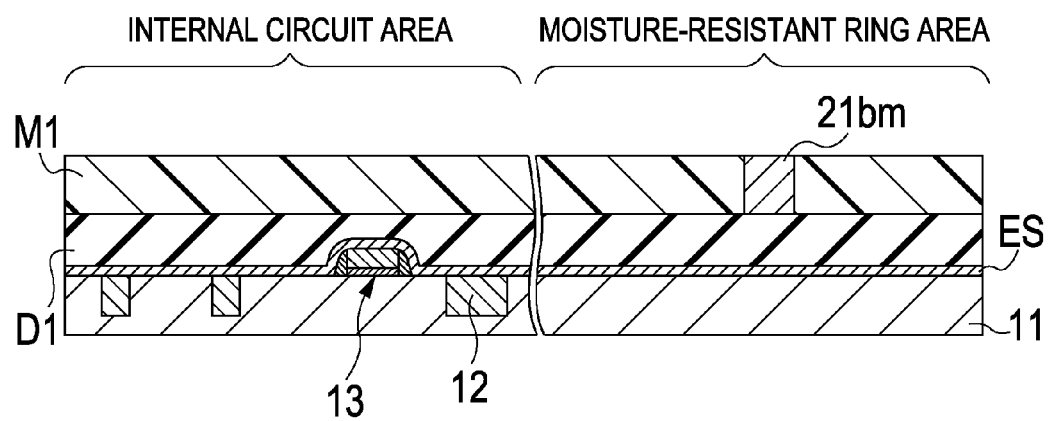

FIG. 17B illustrates a cross-sectional view of the mask layer M1 exposed with the mask P1 taken along a portion of a line XVIIB in FIG. 17A. The mask layer M1 is formed with the exposed portion 21*bm* by exposure with the mask P1. The lines XVIIB in FIG. 17A and FIG. 17B correspond to the line VII in FIG. 6.

Subsequently, the exposure for the second time with the same mask P1 is performed. Prior to it, an area of the mask layer M1 exposed with the mask P1 is moved. More specifically, as illustrated in FIG. 19, the exposed portion P1*mb* on the mask layer M1 exposed for the second time with the mask P1 is arranged in such a manner that the dividing line DL extends across the exposed portion 23*bm* formed by the second connecting portion pattern 23*bp*. Then, with the mask P1, part of the groove-shaped via pattern of the plug portion RP1 of the moisture-resistant ring 20 is formed on the mask layer M1 by exposure.

The exposed portion P1*mb* on the mask layer M1 exposed for the second time with the mask P1 extends to a portion of the adjacent divided area, and is overlapped with the exposed portion P1*ma* by the exposure for the first time with the mask P1. In this manner, a bridge exposure with the mask P1 is performed.

Figure 18A:
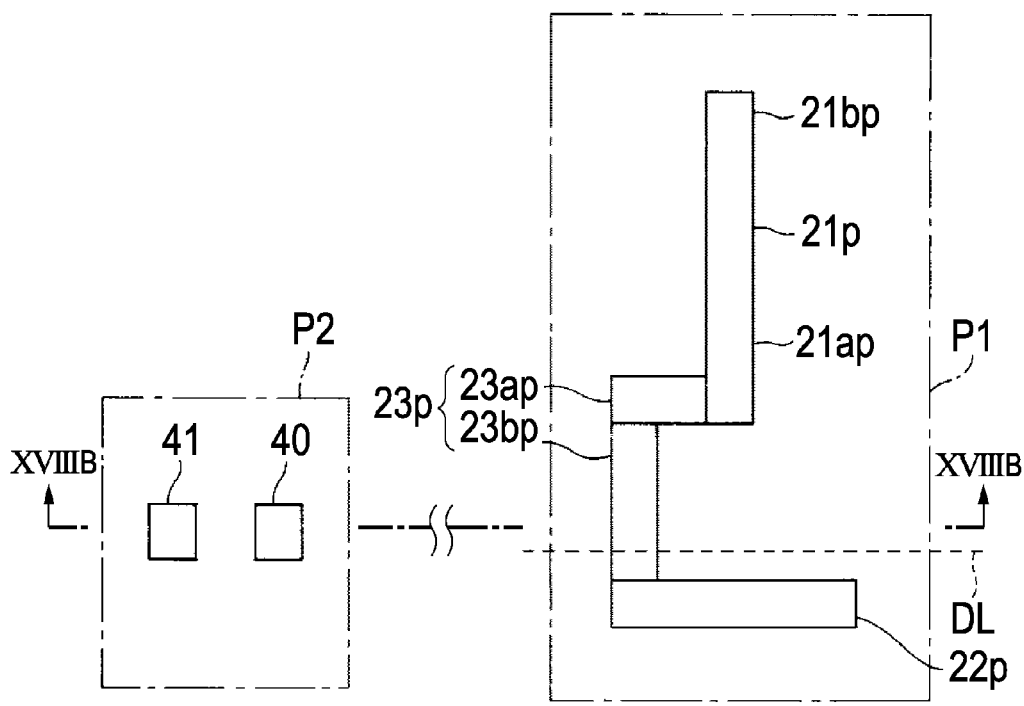
FIGS. 18A and 18B are drawings illustrating a process continuing from FIG. 17.
Figure 18B:
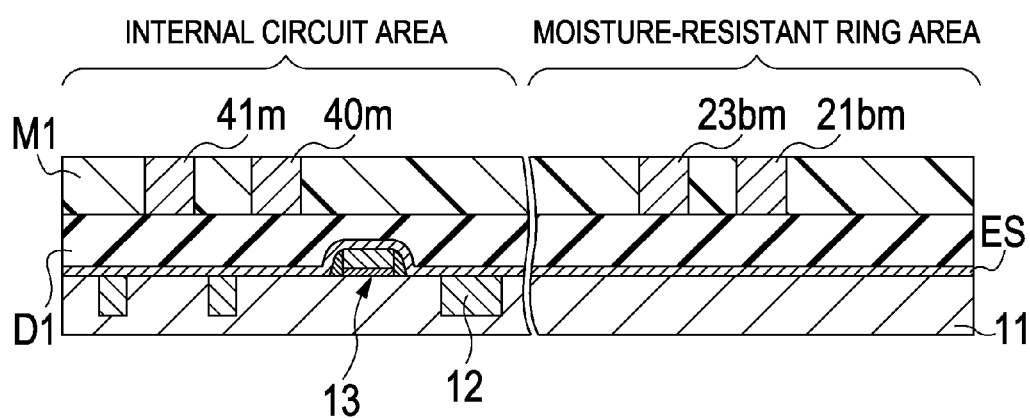

FIG. 18B is a cross-sectional view of the mask layer M1 exposed with the mask P1 taken along a portion of a line XVIIIB in FIG. 18A. The mask layer M1 is formed with the exposed portion 23*bm* by exposure. The lines XVIIIB in FIG. 18A and FIG. 18B correspond to the line VII in FIG. 6.

With these two times of exposure, as illustrated in FIG. 19, the mask layer M1 is exposed so that the exposed portion 22*m* of the mask layer M1 exposed with the vertical portion pattern 22*p* and the exposed portion 21*bm* on the mask layer M1 exposed with the second extending portion pattern 21*bp* intersect orthogonally to each other. The portion where the exposed portion 22*m* and the exposed portion 21*bm* intersect orthogonal to each other is formed within the overlapped portion between the exposed portion P1*ma* and the exposed portion P1*mb*.

The exposed portion 21*am* on the mask layer M1 exposed with the first extending portion pattern 21*ap* and the exposed portion 21*bm* on the mask layer M1 exposed with the second extending portion pattern 21*bp* are apart from each other.

In the same manner, as regards other divided areas D of the mask layer M1, the mask layer M1 is exposed so that the exposed portion 22*m* on the mask layer M1 exposed with the vertical portion pattern 22*p* and the exposed portion 21*bm* on the mask layer M1 exposed with the second extending portion pattern 21*bp* intersect orthogonally to each other. Depending on the divided area, a mask having a different pattern from the mask P1 is used.

In the internal circuit area, a via hole pattern is formed by exposure on the mask layer M1 with a mask P2 by the exposure in FIG. 18B. The mask P1 has via hole patterns 40, 41.

FIG. 18B is a cross-sectional view of the mask layer M1 exposed with the mask P2 taken along a portion of the line XVIIIB illustrated in FIG. 18A. As illustrated in FIG. 18B, the mask layer M1 is formed with exposed portions 40*m*, 41*m* by exposure with the mask P2. The lines XVIIIB in FIG. 18A and FIG. 18B correspond to the line VII in FIG. 6.

For other divided areas D of the mask layer M1, an internal circuit pattern is formed by exposure in the same manner.

In the description described above, the exposed portion P1*mb* is formed after having formed the exposed portion P1*ma* on the mask layer M1 with the mask P1. However, the exposed portion P1*ma* may be formed after having formed the exposed portion P1*mb* on the mask layer M1 with the mask P1 in the reverse order. Although the same mask P1 is used for the two times of exposure, the two times of exposure may be performed with different masks.

As illustrated in FIG. 20A, the mask layer M1 is developed, then the exposed portions 21*bm*, 23*bm* in the moisture-resistant ring area are removed, and groove-shaped vias V1 and V2 are formed. In the same manner, the exposed portions 40*m*, 41*m* in the internal circuit area are removed, and via holes V3, V4 are formed.

Subsequently, as illustrated in FIG. 20B, the insulating layer D1 is etched with the mask layer M1 as a mask, and the ES layer is exposed from bottoms of the groove-shaped vias V1, V2 and the via holes V3, V4. In this etching, for example, an anisotropic etching is performed using gas of CF system or various types of mixed gases.

Subsequently, by Plasma Etching, the mask layer M1 is calcified (ashing) and the mask layer M1 is removed. Subsequently, portions of the ES layer exposed on the bottoms of the groove-shaped vias V1, V2 and the via holes V3, V4 are removed by the plasma etching with the insulating layer D1 as a mask. In this plasma etching, $O_2$ or various types of mixed gases are used.

Subsequently, by the sputtering or the like, a TiN layer is formed in the groove-shaped vias V1, V2 and the via holes V3, V4 on the insulating layer D1. Subsequently, a W layer is formed on the TiN layer by CVD or the like using $WF_6$ gas. The thickness of the TiN layer may be, for example, 50 nm. The thickness of the W layer may be, 400 nm.

Subsequently, by the CMP method, the excessive W layer and TiN layer on the insulating layer D1 are removed and, as illustrated in FIG. 21A, the plug portion RP1a of the moisture-resistant ring 20 is formed in the groove-shaped via V1 and the plug portion RP1b of the moisture-resistant ring 20 is formed in the groove-shaped via V2. The plug portion RP1a and the plug portion RP1b form part of the plug portion RP1 of the moisture-resistant ring 20.

Simultaneously, plug portions CP1a, CP1b of the internal circuit 30 are formed in the via holes V3, V4. The plug portion CP1a and the plug portion CP1b form part of the plug portion CP1 of the internal circuit 30.

Subsequently, as illustrated in FIG. 21A, the etching stopper layer ES is formed on the insulating layer D1 by the CVD or the like. The thickness of the etching stopper layer ES may be, for example, 50 nm.

Subsequently, as illustrated in FIG. 21B, the wiring layer W1 is formed on the etching stopper layer ES by the CVD or the like. The wiring layer W1 is formed using, for example, $SiO_2$. The thickness of the wiring layer W1 may be, for example, 300 nm.

Subsequently, a mask layer M2 is formed on the wiring layer W1. The mask layer M2 is formed using, for example, photoresist.

Subsequently, with a mask P3 illustrated in FIG. 22A, a wiring portion pattern RW1p which forms the groove-shaped via of the wiring portion RW1 in the moisture-resistant ring 20 is formed on the mask layer M1 by exposure. The mask P3 includes the vertically elongated rectangular wiring portion pattern RW1p.

Figure 22A:
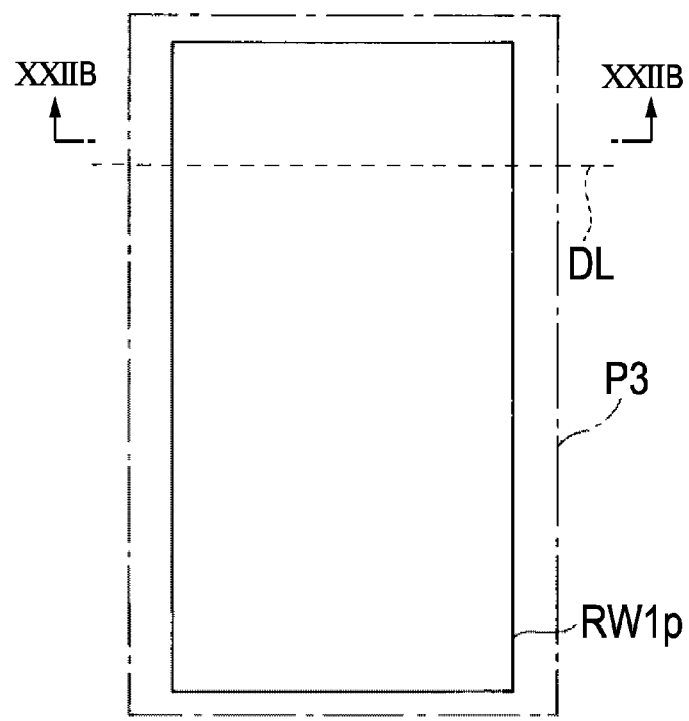
FIGS. 22A and 22B are drawings illustrating a process continuing from FIG. 21.
Figure 24:
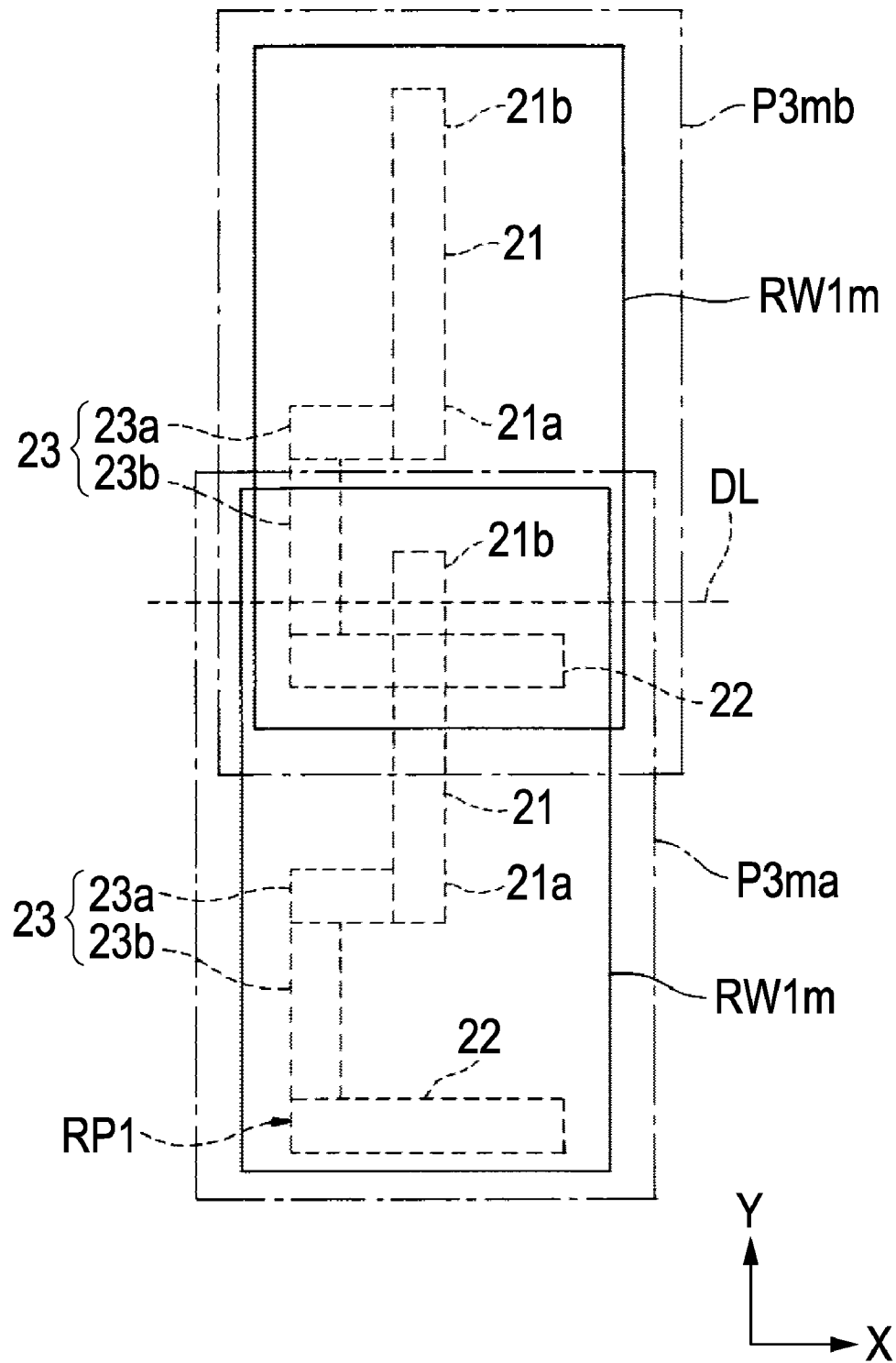
FIG. 24 is a plan view illustrating an exposed portion of a mask layer formed with a wiring portion pattern.

An exposed portion P3ma formed on the mask layer M1 by exposure for the first time with the mask P3 illustrated in FIG. 22A is illustrated in FIG. 24. An exposed portion RW1m is formed on the mask layer M1 by the wiring portion patterns RW1p. FIG. 24 also illustrates an exposed portion P3mb formed on the mask layer M1 by exposure for the second time with the mask P3.

In FIG. 24, for easy understanding of the description, the positions of the exposed portions P3ma, P3mb on the mask layer M2 exposed with the mask P3 by the two times of exposure are illustrated to be displaced from each other in the X-direction.

In the exposure for the first time, as illustrated in FIG. 24, the exposed portion P3ma on the mask layer M2 exposed with the mask P3 is arranged with respect to the mask layer M2 so as to cover the extending portion 21, the joint portion 23, and the vertical portion 22 as a basic configuration of the plug portion RP1 formed in the insulating layer D1. The basic configuration of the plug portion RP1 is illustrated by a broken line in FIG. 24.

The exposed portion P3ma on the mask layer M2 exposed with the mask P3 is arranged with respect to the mask layer M2 so that the dividing line DL extends across one of end portions on the side which covers the second extending portion 21b. The exposed portion P3ma on the mask layer M1 exposed with the mask P3 extends to a portion of the adjacent divided area.

Figure 22B:
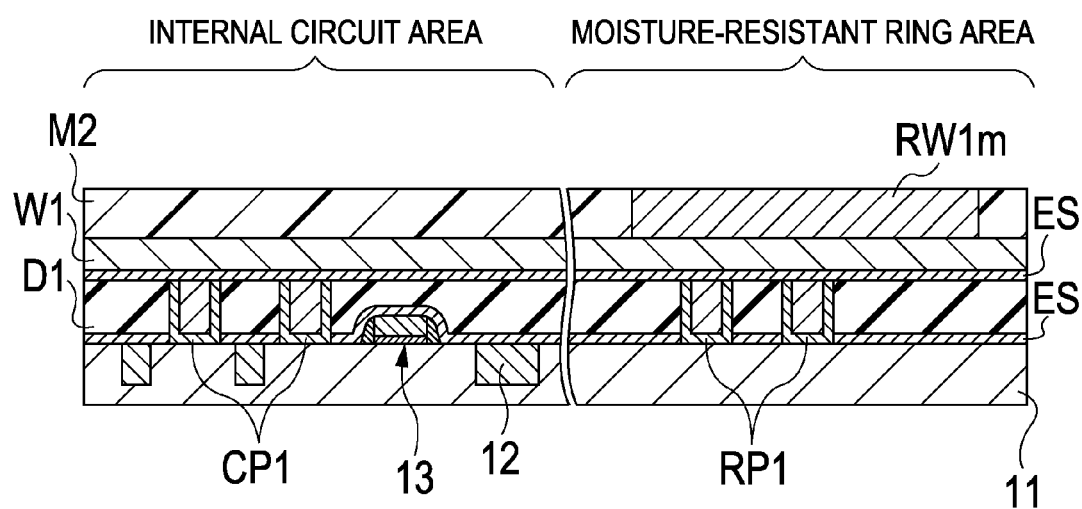

FIG. 22B is a cross-sectional view of the mask layer M2 exposed with the mask P3 taken along a portion of a line XXIIB in FIG. 22A. The mask layer M2 is formed with the exposed portion RW1m by exposure with the mask P3. The lines XXIIB in FIG. 22A and FIG. 22B correspond to the line VII in FIG. 6.

Subsequently, the exposure for the second time with the same mask P3 is performed. Prior to it, an area of the mask layer M2 exposed with the mask P3 is moved. More specifically, as illustrated in FIG. 24, the exposed portion P3mb on the mask layer M2 exposed with the mask P3 is arranged with respect to the mask layer M2 so that the dividing line DL extends across the other one of the end portions on the side which covers the vertical portion 22. Then, with the mask P3, the wiring portion patterns RW1p is formed on the mask layer M2 by exposure.

The exposed portion P3mb on the mask layer M1 exposed for the second time with the mask P3 extends to a portion of the adjacent divided area, and is overlapped with the exposed portion P3ma by the exposure for the first time with the mask P3. In this manner, the bridge exposure with the mask P3 is performed.

Figure 23A:
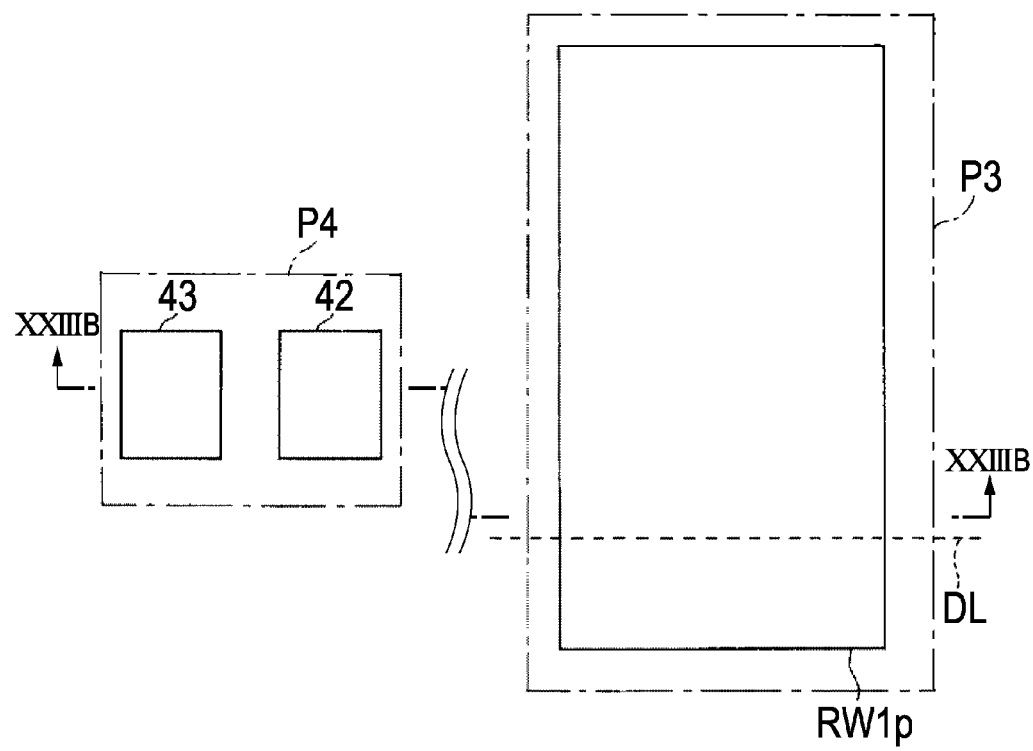
FIGS. 23A and 23B are drawings illustrating a process continuing from FIG. 22.
Figure 23B:
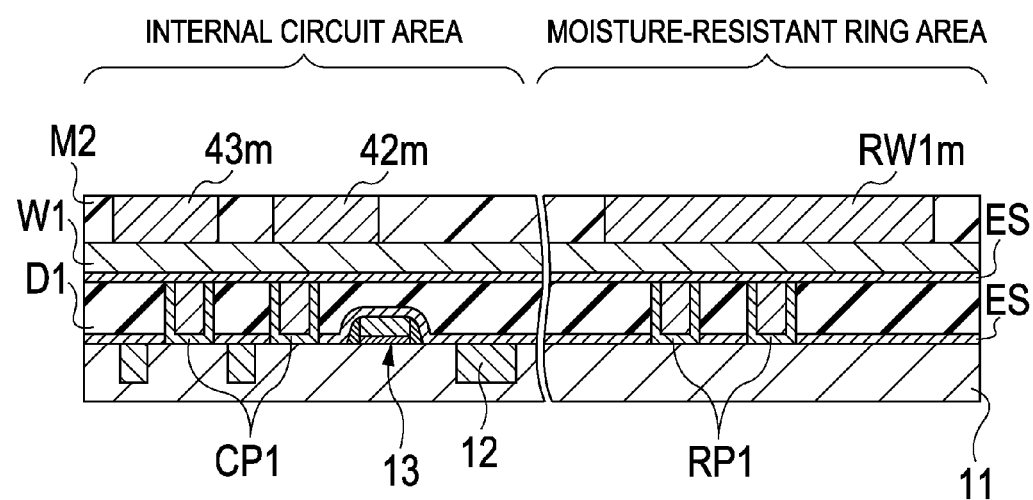

FIG. 23B is a cross-sectional view of the mask layer M2 exposed with the mask P3 taken along a portion of a line XXIIIB illustrated in FIG. 23A. The mask layer M2 is formed doubly with the exposed portion RW1m by exposure for the second time with the mask P3. The lines XXIIIB in FIG. 23A and FIG. 23B correspond to the line VII in FIG. 6.

As illustrated in FIG. 24, the exposed portions RW1m continued in the Y-direction like a band is formed with these two times of exposures. The exposed portions RW1m continued in the band shape are formed so as to cover the plug portion RP1.

For other divided areas D of the mask layer M1, the wiring portion pattern is formed by exposure so as to cover the plug portion on the lower layer. Depending on the divided area, a mask having a different pattern from the mask P3 is used.

In the internal circuit area, a wiring portion pattern is formed by exposure on the mask layer M2 with a mask P4 by the exposure in FIG. 23B. The mask P4 has wiring portion patterns 42, 43.

As illustrated in FIG. 23B, the mask layer M2 is formed with exposed portions 42m, 43m by exposure with the mask P4. FIG. 23B is a cross-sectional view of the mask layer M2 exposed with the mask P4 taken along a portion of a line XXIIIB illustrated in FIG. 23A. The lines XXIIIB in FIG. 23A and FIG. 23B correspond to the line VII in FIG. 6.

In the description described above, the exposed area P3mb is formed after having formed the exposed area P3ma on the mask layer M1 by exposure with the mask P3. However, the exposed area P3ma may be formed after having formed the exposed area P3mb on the mask layer M1 with the mask P3 in the reverse order. Although the same mask P3 is used for the two times of exposure, the two times of exposure may be performed using different masks.

Figure 25A:
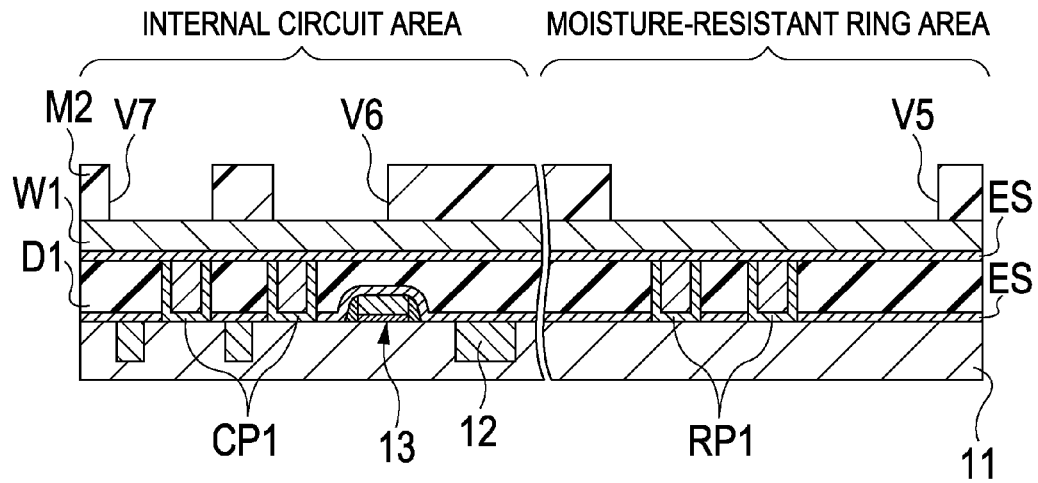
FIGS. 25A-25C are drawings illustrating a process continuing from FIG. 23.

As illustrated in FIG. 25A, the mask layer M2 is developed, then the exposed portion RW1m in the moisture-resistant ring area are removed, and a trench V5 is formed. In the same manner, the exposed portions 42m, 43m in the internal circuit area are removed, and trenches V6, V7 are formed.

Figure 25B:
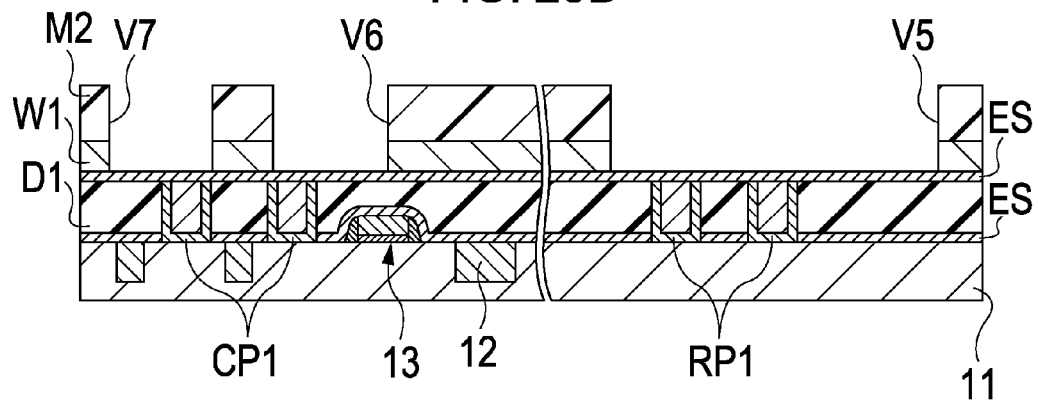

Subsequently, as illustrated in FIG. 25B, the wiring layer W1 is etched with the mask layer M2 as a mask, and the ES layer is exposed from bottoms of the trench V5 and the trenches V6, V7. In this etching, for example, the anisotropic etching is performed using gas of CF system or various types of mixed gases.

Subsequently, by the plasma etching, the mask layer M2 is calcified (ashing) and the mask layer M2 is removed. Subsequently, portions of the ES layer exposed on the bottoms of the trench V5 and the trenches V6, V7 are removed by the plasma etching with the wiring layer W1 as a mask. In this plasma etching, $O_2$ or various types of mixed gases are used.

Subsequently, by the sputtering or the like, a Ta layer as a barrier metal is formed in the trench V5 and the trenches V6, V7, and on the wiring layer W1. The thickness of the Ta layer may be, for example, 20 nm. Subsequently, by the sputtering or the like a Cu layer is formed on the Ta layer. The thickness of the Cu layer may be, for example, 80 nm. The Cu layer is used as an electrode of electrolytic plating which is performed subsequently. Subsequently, another Cu layer is formed on the above-described Cu layer by the electrolytic plating. The thickness of the Cu layer formed by this electrolytic plating may be, for example, 1 μm.

Figure 25C:
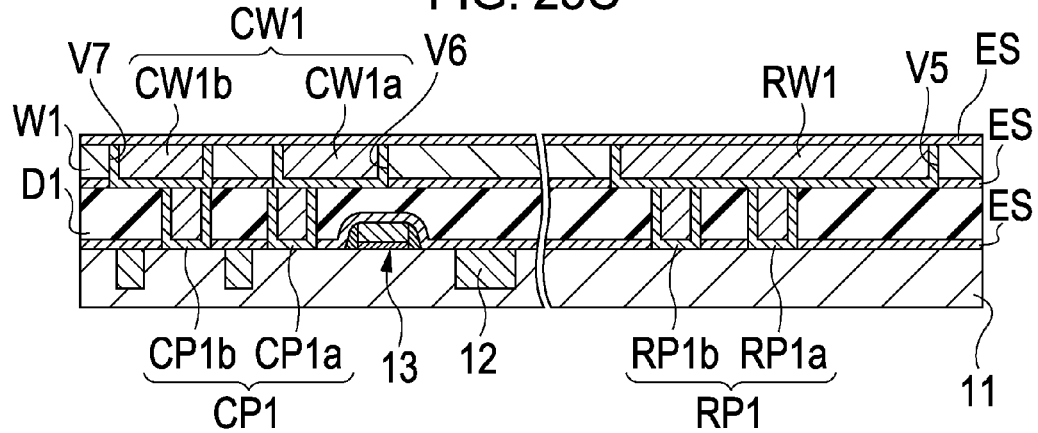

Subsequently, by the CMP method, the excessive Cu layer and Ta layer on the wiring layer W1 are removed and, as illustrated in FIG. 25C, the wiring portion RW1 of the moisture-resistant ring 20 is formed in the trench V5.

Simultaneously, wiring portions CW1a, CW1b of the internal circuit 30 are formed in the trenches V6, V7. The wiring portion CW1a and the wiring portion CW1b form the wiring portion CW1 of the internal circuit 30.

Subsequently, as illustrated in FIG. 25C, the etching stopper layer ES is formed on the wiring layer W1 by the CVD or the like. The thickness of the etching stopper layer ES may be, for example, 70 nm. The etching stopper layer ES prevents dispersion of Cu.

Figure 26:
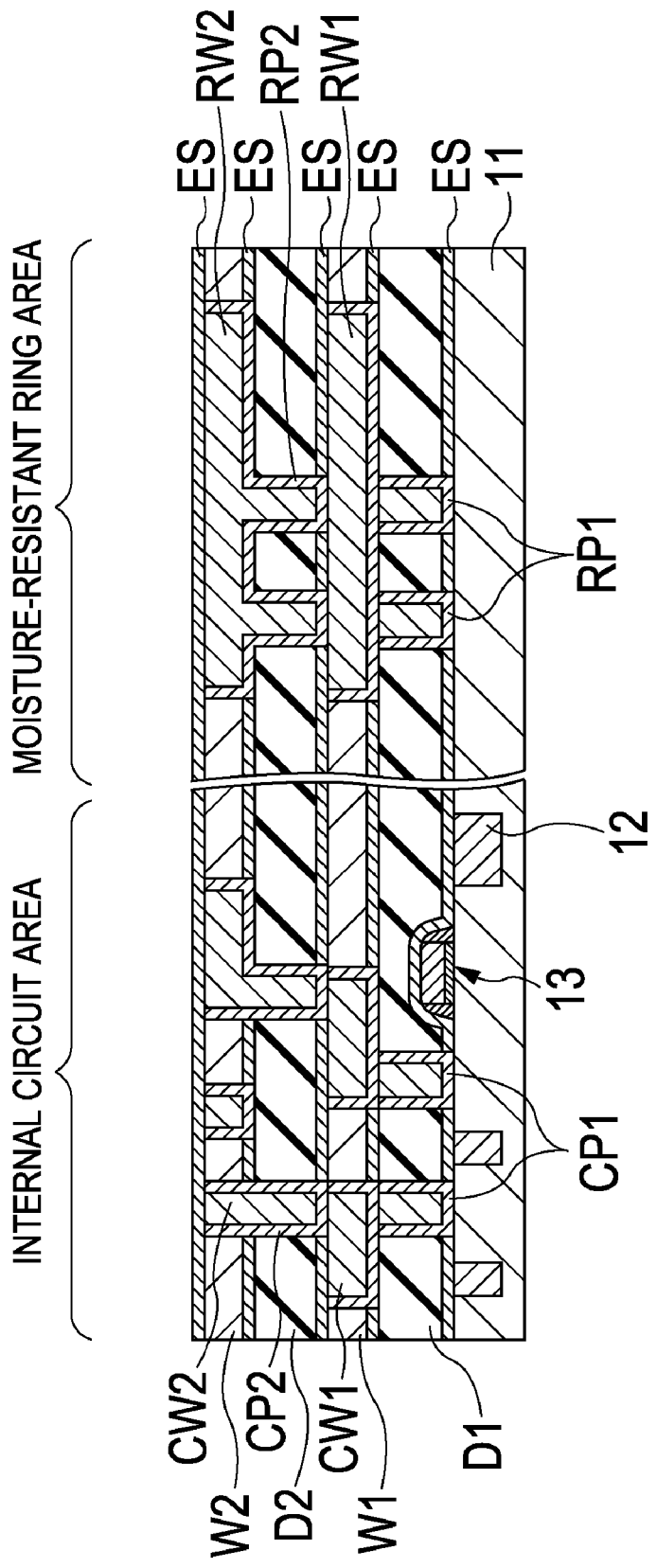
FIG. 26 is a drawing illustrating a process continuing from FIG. 25.

Subsequently, as illustrated in FIG. 26, in the moisture-resistant ring area, the plug portion RP2 and the wiring portion RW2 of the moisture-resistant ring 20 are formed on the wiring layer W1. The plug portion RP2 and the wiring portion RW2 are formed using, for example, Dual Damascene method.

Also, the insulating layer D2, the etching stopper layer ES arranged on the insulating layer D2, the wiring layer W2, and the etching stopper layer ES arranged on the wiring layer W2 are formed together with the formation of the plug portion RP2 and the wiring portion RW2. The thickness of the insulating layer D2 may be, for example, 500 nm. The thickness of the etching stopper layer ES may be, for example, 70 nm. The thickness of the wiring layer W2 may be, for example, 300 nm.

The groove-shaped via which forms the plug portion RP2 is formed using the same method as described with reference to FIGS. 17 to 19.

The groove-shaped via which forms the plug portion RW2 is formed using the same method as described with reference to FIGS. 22 to 24.

In the internal circuit area, the plug portion RP2 and the wiring portion RW2 are formed and, the plug portion CP2 and the wiring portion CW2 are also formed.

Subsequently, using the same method as described above, the insulating layers D3 to D5, the wiring layers W3 to W4, the respective etching stopper layers ES, the plug portions RP3 to RP5 of the moisture-resistant ring 20, the plug portions CP3 to CP5 and the wiring portions CW3 to CW4 are formed.

The wiring portion RW5 of the moisture-resistant ring 20 and the wiring portion CW5 of the internal circuit 30 which are in the uppermost layer are formed by interposing an AlCu layer between the TiN layers.

Subsequently, the first protecting layer CV1 and the second protecting layer CV2 are laminated in sequence so as to cover the wiring portion RW5 of the moisture-resistant ring 20 and the wiring portion CW5 of the internal circuit 30 which are in the uppermost layer so that the semiconductor device as illustrated in FIG. 6 is formed.

Subsequently, a preferred positional relationship of an exposed portion when the groove-shaped via of the plug portion RP1 of the moisture-resistant ring 20 is formed on the mask layer M1 by exposure by the two times of exposure illustrated in FIG. 19 will be described with reference to FIGS. 27 to 32.

Figure 27:
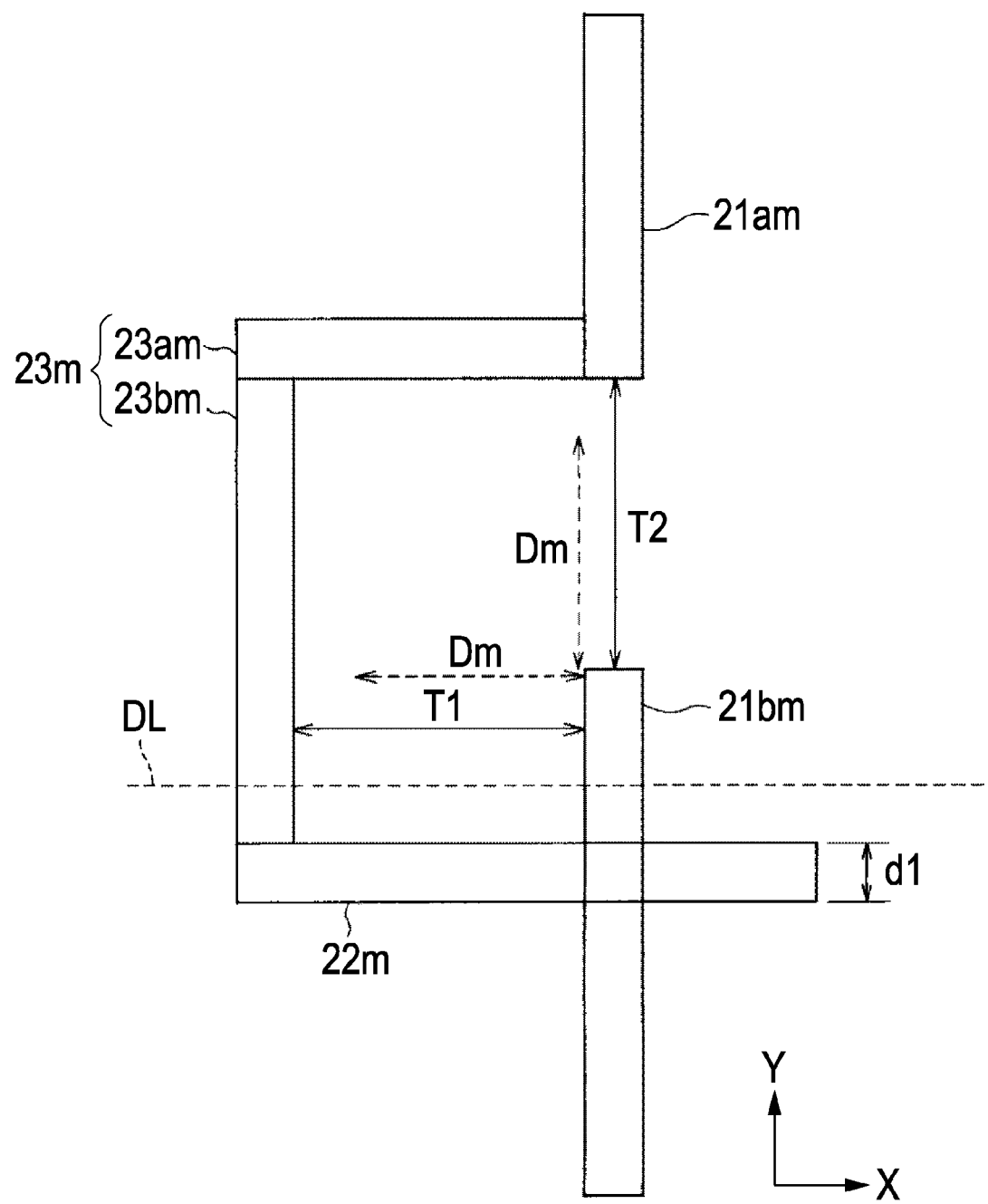
FIG. 27 is a drawing for explaining an exposed portion on the mask layer formed by exposure with the plug portion pattern.

FIG. 27 illustrates a partial enlarged view of the exposed portion illustrated in FIG. 19.

In FIG. 27, the exposed portion 21bm formed by the second extending portion pattern 21bp is formed by the exposure for the first time in FIG. 19. Also, the exposed portion 21am, exposed portion 22m, and the exposed portion 23m having the exposed portion 23am and the exposed portion 23bm are formed by the exposure for the second time in FIG. 19.

The respective exposed portions 21bm, 21am, 22m, and 23m formed on the mask layer M1 have a width d1.

In the exposure for the first time, a maximum amount of displacement of the position where the mask P1 is actually formed on the mask layer M1 by exposure with respect to the position where the mask P1 may be formed on the mask layer M1 by exposure is expressed as D5. Also, in the exposure for the second time, a maximum amount of displacement of the position where the mask P1 is actually formed on the mask layer P3 by exposure with respect to the position where the mask P1 may be formed on the mask layer M1 by exposure is expressed as D6. Then, the sum of the maximum amounts of displacement D5 and D6 is expressed as Dm. The value Dm is a relative maximum amount of displacement between the exposed portions formed by the two times of exposure. The maximum amount of displacement Dm is assumed to have the same value in the X-direction and the Y-direction.

Then, a design amount T1 of separation in the X-direction between the exposed portion 21bm exposed with the second extending portion pattern 21bp and the exposed portion 23bm exposed with the second connecting portion pattern 23bp preferably satisfies a relationship T1>Dm+d1.

In the same manner, a design amount T2 of separation in the Y-direction between the exposed portion 21am exposed with the first extending portion pattern 21ap and the exposed portion 21bm exposed by the second extending portion pattern 21bp preferably satisfies a relationship T2>Dm+d1.

Figure 28:
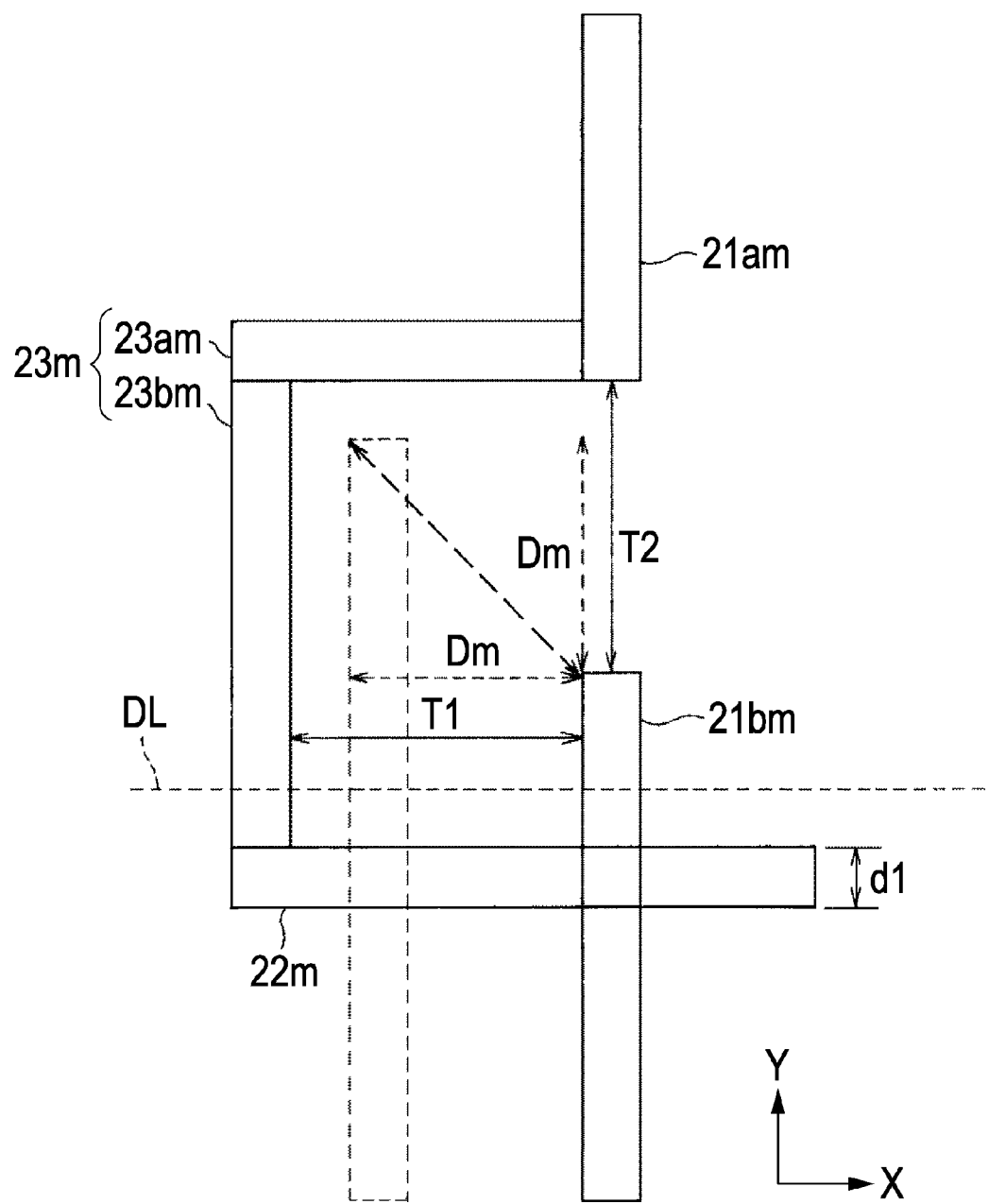
FIG. 28 is a drawing for explaining an exposed portion on the mask layer formed by exposure with the plug portion pattern.

When the value T1 or T2 satisfies the above-described relationship, even when the amount of relative displacement between the two exposed portions reaches the maximum amount Dm in the X-direction or the Y-direction, the exposed portion 21bm is prevented from being overlapped with the exposed portions other than the exposed portion 22m as illustrated in FIG. 28.

Therefore, the second extending portion 21b formed by the exposed portion 21bm is prevented from being overlapped with portions of other plug portions other than the vertical portion 22.

Figure 29:
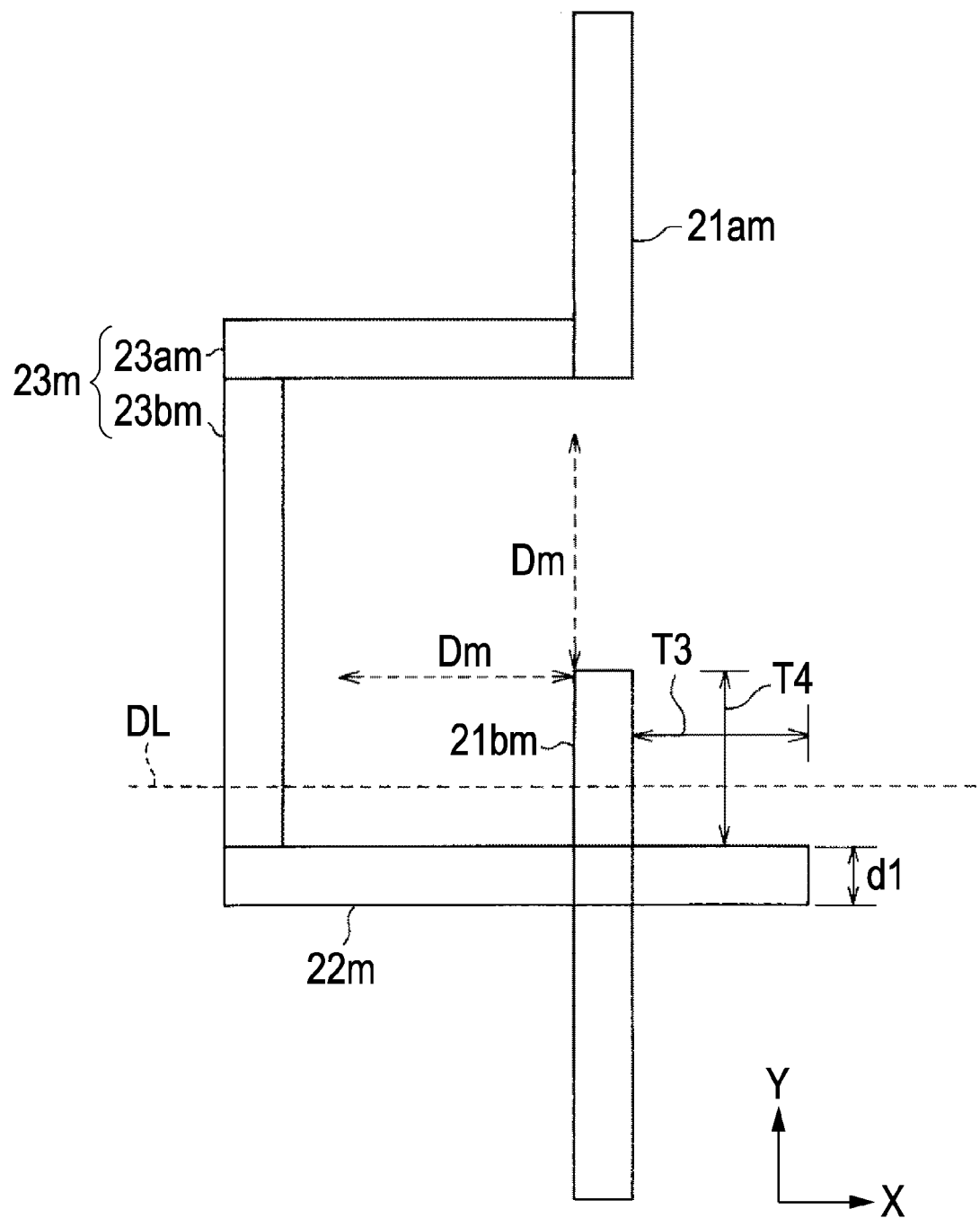
FIG. 29 is a drawing for explaining an exposed portion on the mask layer formed by exposure with the plug portion pattern.

As illustrated in FIG. 29, a design amount T3 of separation in the X-direction between the exposed portion 21bm exposed with the second extending portion pattern 21bp and a free end of the exposed portion 22m on the mask layer M1 exposed with the vertical portion pattern 22p preferably satisfies a relationship T3>Dm−d1.

In the same manner, a design amount T4 in the Y-direction that a free end of the exposed portion 21bm exposed with the second extending portion pattern 21bp projects from the exposed portion 22m exposed with the vertical portion pattern 22p preferably satisfies a relationship T4>Dm−d1.

Figure 30:
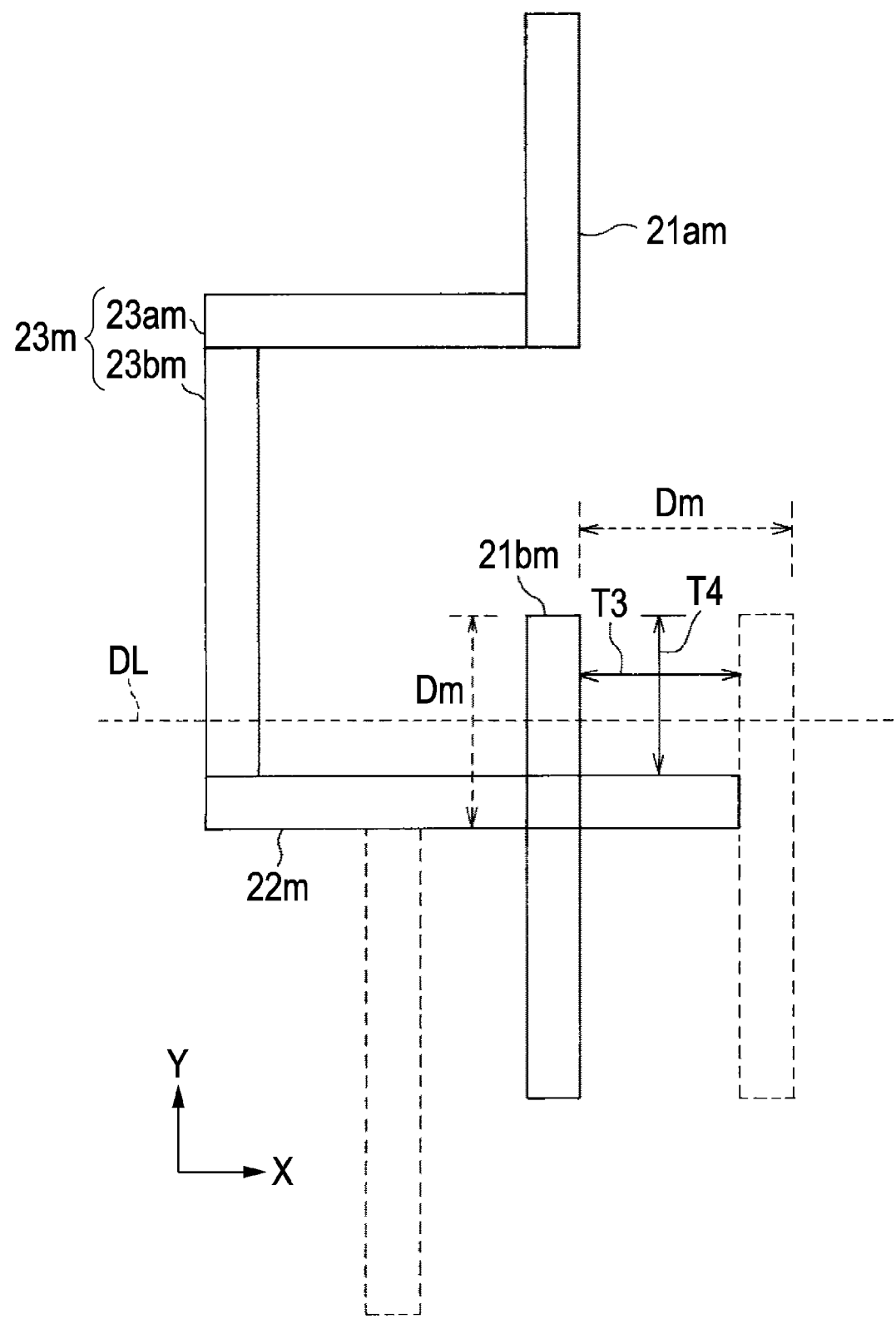
FIG. 30 is a drawing for explaining an exposed portion on the mask layer formed by exposure with the plug portion pattern.

When the value T3 or T4 satisfies the above-described relationship, even when the amount of relative displacement between the two exposed portions reaches the maximum amount Dm in the X-direction or the Y-direction, connection between the exposed portion 21bm and the exposed portion 22m is ensured as illustrated in FIG. 30.

Therefore, the second extending portion 21b formed by the exposed portion 21bm is ensured to be connected to the vertical portion 22.

Figure 31:
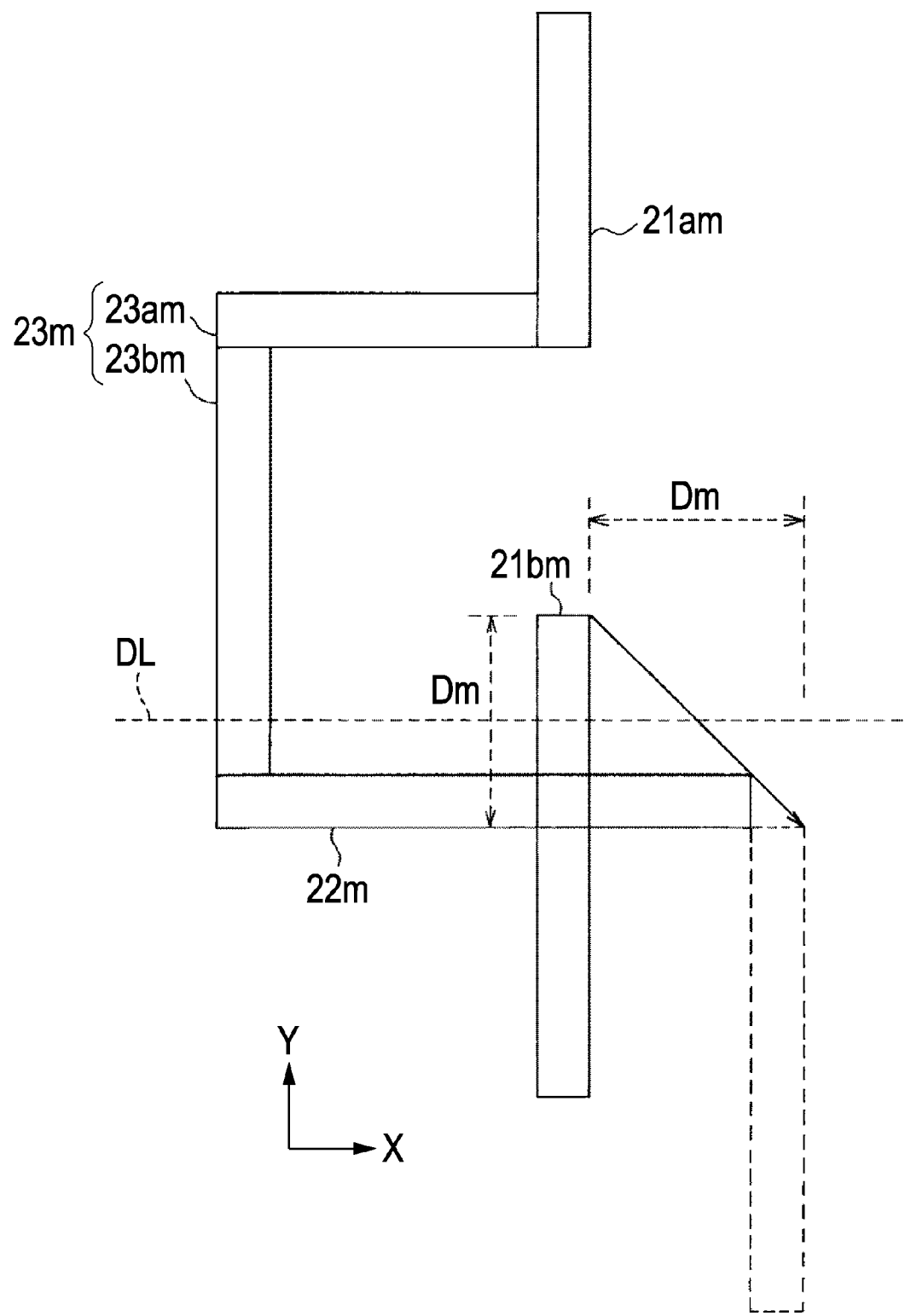
FIG. 31 is a drawing for explaining an exposed portion on the mask layer formed by exposure with the plug portion pattern.

Incidentally, even when the value T3 or T4 satisfies the above-described relationship, when the amount of relative displacement between the two exposed portions reaches the maximum amount Dm in the X-direction and the Y-direction, the exposed portion 21$bm$ and the exposed portion 22$m$ might not be connected as illustrated in FIG. 31.

Accordingly, the value T3 preferably satisfies a relationship T3>Dm−d1+d1=Dm. In the same manner, the value T4 preferably satisfies a relationship T4>Dm−d1+d1=Dm.

Figure 32:
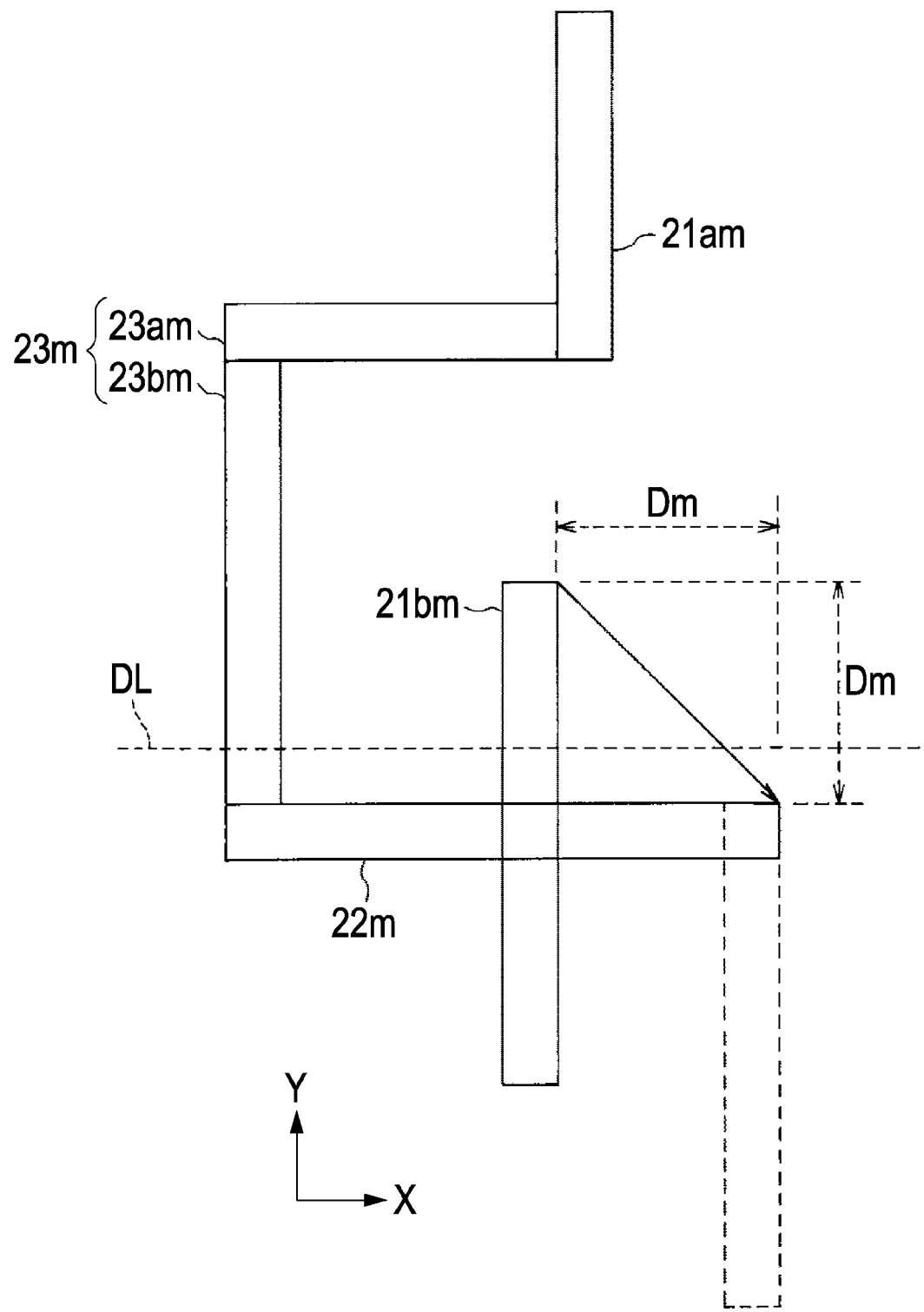
FIG. 32 is a drawing for explaining an exposed portion on the mask layer formed by exposure with the plug portion pattern.

When the value T3 or T4 satisfies the above-described relationship, even when the amount of relative displacement between the two exposed portions reaches the maximum amount Dm in the X-direction and the Y-direction, the connection between the exposed portion 21$bm$ and the exposed portion 22$m$ is reliably ensured as illustrated in FIG. 32.

Therefore, the second extending portion 21$b$ formed by the exposed portion 21$bm$ is reliably ensured to be connected to the vertical portion 22.

According to the method of manufacturing the semiconductor device in this embodiment, when the moisture-resistant ring extending across the divided areas is formed by exposure with the plurality of masks, the vertical portion 22 and the second extending portion 21$b$ intersect orthogonally to each other even when the positions of exposure of the mask patterns on the mask layer are displaced. Therefore, the semiconductor device 10 having the continued moisture-resistant ring 20 may be manufactured.

According to the method of manufacturing the semiconductor device in this embodiment, since the vertical portion 22 and the second extending portion 21$b$ extending from the adjacent divided area beyond the dividing line DL extend orthogonally to each other, the width of the portion where the vertical portion 22 and the second extending portion 21$b$ are overlapped with each other is the same as the width of other plug portions. Therefore, a wide groove-shaped via is not formed, and hence occurrence of the defective formation of the groove-shaped via and the defective embedding of the conductor which forms the plug portion of the moisture-resistant ring 20 is prevented.

Furthermore, according to the method of manufacturing the semiconductor device in this embodiment, the first extending portion 21$a$ and the second extending portion 21$b$ are not overlapped with each other. Also, the first extending portion 21$a$ and the joint portion 23 are not overlapped with each other. Therefore, the wide groove-shaped via is not formed, and hence occurrence of the defective formation of the groove-shaped via and the defective embedding of the conductor which forms the plug portion of the moisture-resistant ring 20 is prevented.

Although the description of the method of manufacturing the semiconductor device in the embodiment as described above has been described with an example in which the groove-shaped via of the plug portion RP1 of the moisture-resistant ring 20 is formed by exposure, the above-described description is also applied to the case where other plug portions of the moisture-resistant ring 20 are formed.

Subsequently, a modification of the mask P1 used for forming the groove-shaped via of the plug portion RP1 of the moisture-resistant ring described above will be described with reference to FIGS. 33 to 36.

Figure 33:
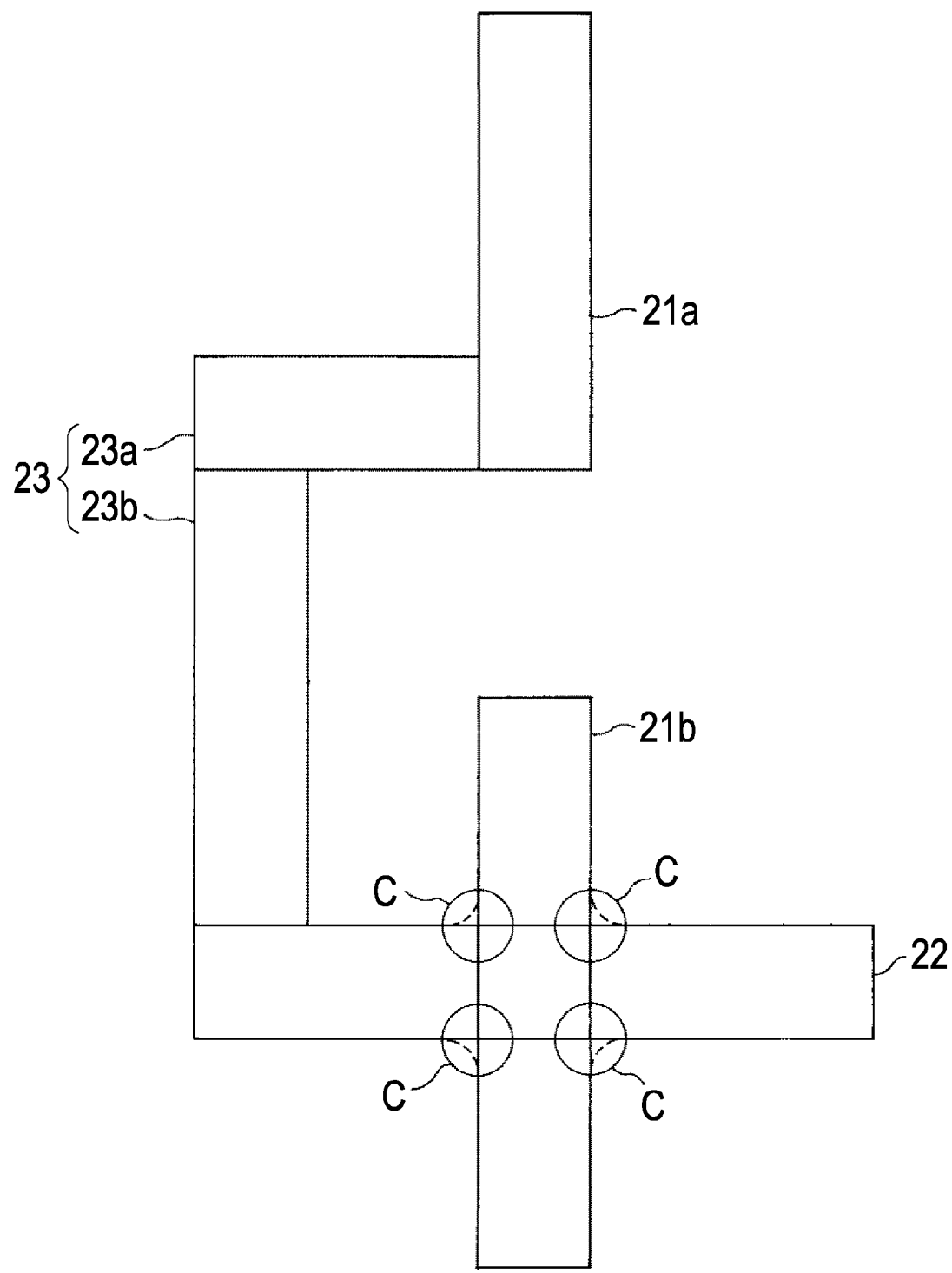
FIG. 33 is a drawing for explaining a plug portion of the moisture-resistant ring formed by multiple exposures.

FIG. 33 is a plan view illustrating a part of the plug portion RP1 formed by the two times of exposure with the mask P1. As regards a portion where the second extending portion 21$b$ and the vertical portion 22 are overlapped with each other, the two times of exposure are performed on the same portion on the mask layer M1.

Even with one time of exposure, a portion in the periphery of the exposed portion on the mask layer M1 is exposed with a slight spread by the spread of irradiation. When the same portion of the mask layer M1 is subjected to the two times of exposure, the amount of exposure in the periphery of the exposed portion is further increased, so that the range of the groove after the development may becomes larger than the design value.

Therefore, in the exposed portion on the mask layer M1 which is subjected to the two times of exposure, the groove-shaped via formed after the development may be formed with a wider groove width as illustrated in a portion surrounded by a circle C in FIG. 33. In this manner, the plug portion RP1 of the moisture-resistant ring 20 may be formed with a portion wider than the design value.

Therefore, a modification of the mask P1 for preventing generation of the wider portion on the plug portion RP1 even when the same portion of the mask layer M1 is subjected to the two times of exposures will be described below.

Figure 34:
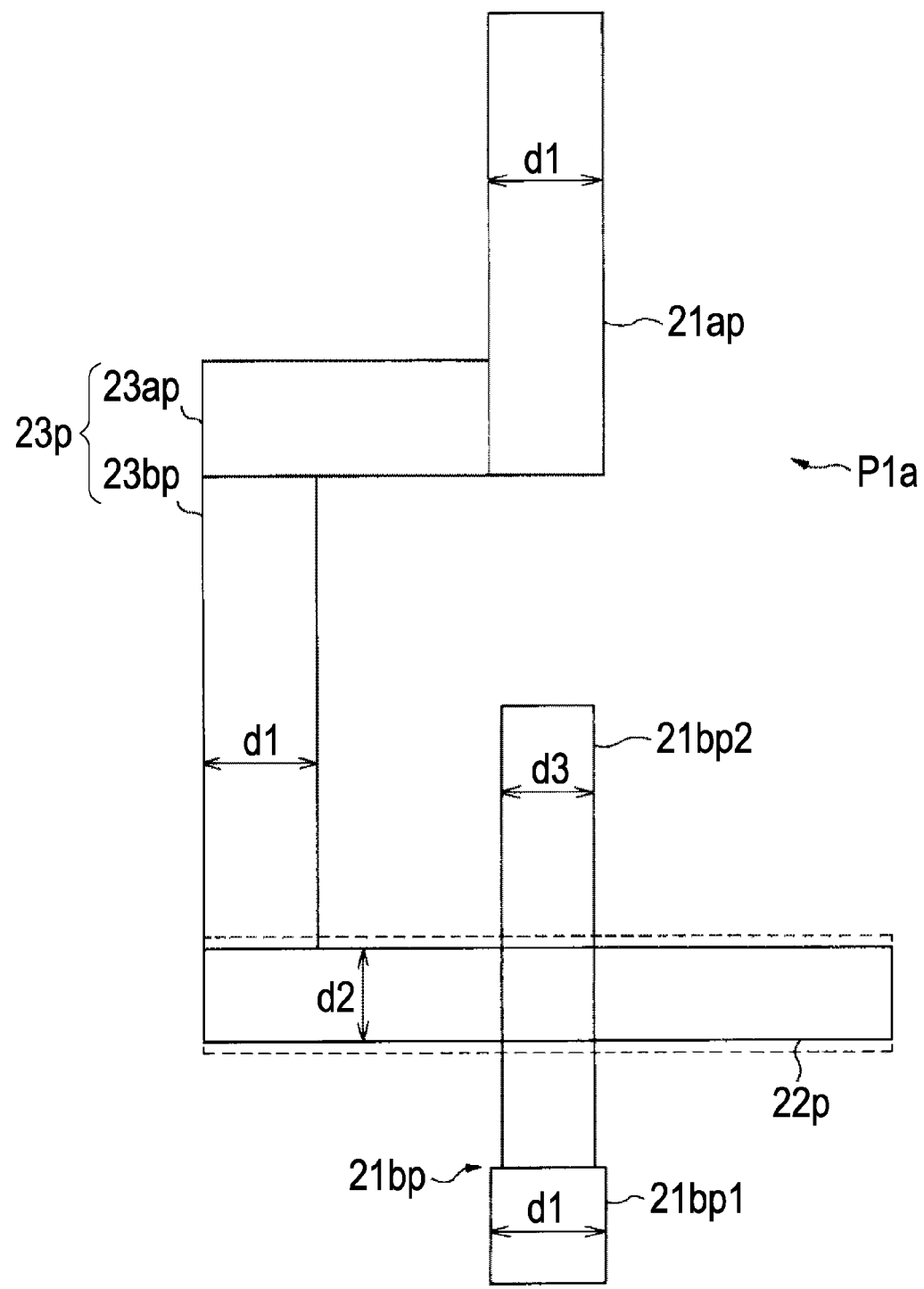
FIG. 34 is a drawing illustrating a modification 1 of a mask used for exposing the plug portion of the moisture-resistant ring.

FIG. 34 is a drawing illustrating a modification 1 of the mask P1.

In a mask P1$a$ in the modification 1, the first extending portion pattern 21$ap$, the first connecting portion pattern 23$ap$, and the second connecting portion pattern 23$bp$ have the width d1.

The width of the vertical portion pattern 22$p$ of the mask P1$a$ is narrower than the width of the first extending portion pattern 21$ap$, and has a width d2. A broken line in FIG. 34 illustrates a vertical portion pattern in a case where it has the width d1. The width d2 satisfies a relationship d2<d1.

The second extending portion pattern 21$bp$ of the mask P1$a$ includes a wide portion 21$bp$1 having the same width d1 as the first extending portion pattern 21$ap$ and a narrow portion 21$bp$2 having a width d3 narrower than the width of the first extending portion pattern 21$ap$. The width d3 satisfies a relationship d3<d1.

Then, when exposing the mask layer M1 with the mask P1$a$, the mask layer M1 is exposed so that the exposed portion on the mask layer M1 exposed with the vertical portion pattern 22$p$ and the exposed portion on the mask layer M1 exposed with the narrow portion 21$bp$2 of the second extending portion pattern 21$bp$ intersect orthogonally to each other.

The width d2 of the vertical portion pattern 22$p$ and the width d3 of the narrow portion 21$bp$2 are set adequately together with the width d1 depending on exposure conditions so that a wider portion is not generated in the plug portion RP1. The width d2 and the width d3 may be the same.

Figure 35:
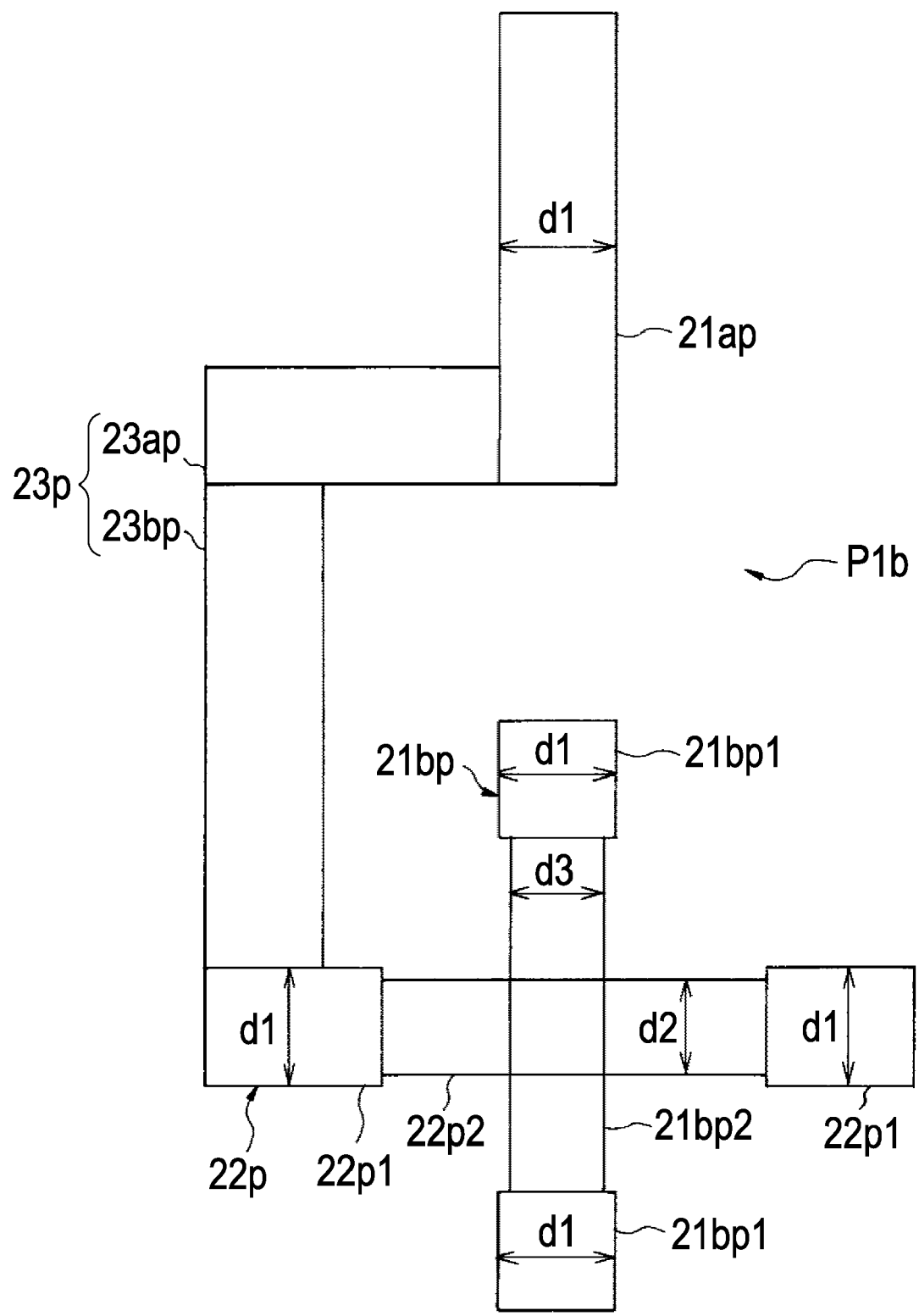
FIG. 35 is a drawing illustrating a modification 2 of the mask used for exposing the plug portion of the moisture-resistant ring.

FIG. 35 is a drawing illustrating a modification 2 of the mask P1.

In the mask P1$b$ in the modification 2, the first extending portion pattern 21$ap$, the first connecting portion pattern 23$ap$, and the second connecting portion pattern 23$bp$ have the width d1.

The vertical portion pattern 22$p$ of the mask P1$b$ in the modification 2 has a first wide portion 22$p$1 having the same width d1 as the first extending portion pattern 21$ap$ and a first narrow portion 22$p$2 having a width d2 narrower than the width of the first extending portion pattern 21$ap$. The width d2 satisfies a relationship d2<d1.

Also, the second extending portion pattern 21$bp$ of the mask P1$b$ has the second wide portion 21$bp$1 having the same width d1 as the first extending portion pattern 21$ap$ and the second narrow portion 21$bp$2 having the width d3 narrower than the width of the first extending portion pattern 21$ap$. The width d3 satisfies a relationship d3<d1.

Then, when exposing the mask layer M1 with the mask P1$a$, the mask layer M1 is exposed so that the exposed portion on the mask layer M1 exposed with the first narrow portion 22$p$2 of the vertical portion pattern 22$p$ and the exposed portion on the mask layer M1 exposed with the second narrow portion 21bp2 of the second extending portion pattern 21bp intersect orthogonally to each other.

The width d2 of the first narrow portion 22p2 and the width d3 of the second narrow portion 21bp2 are set adequately together with the width d1 depending on the exposure conditions so that the wider portion is not generated in the plug portion RP1. The width d2 and the width d3 may be the same.

Figure 36:
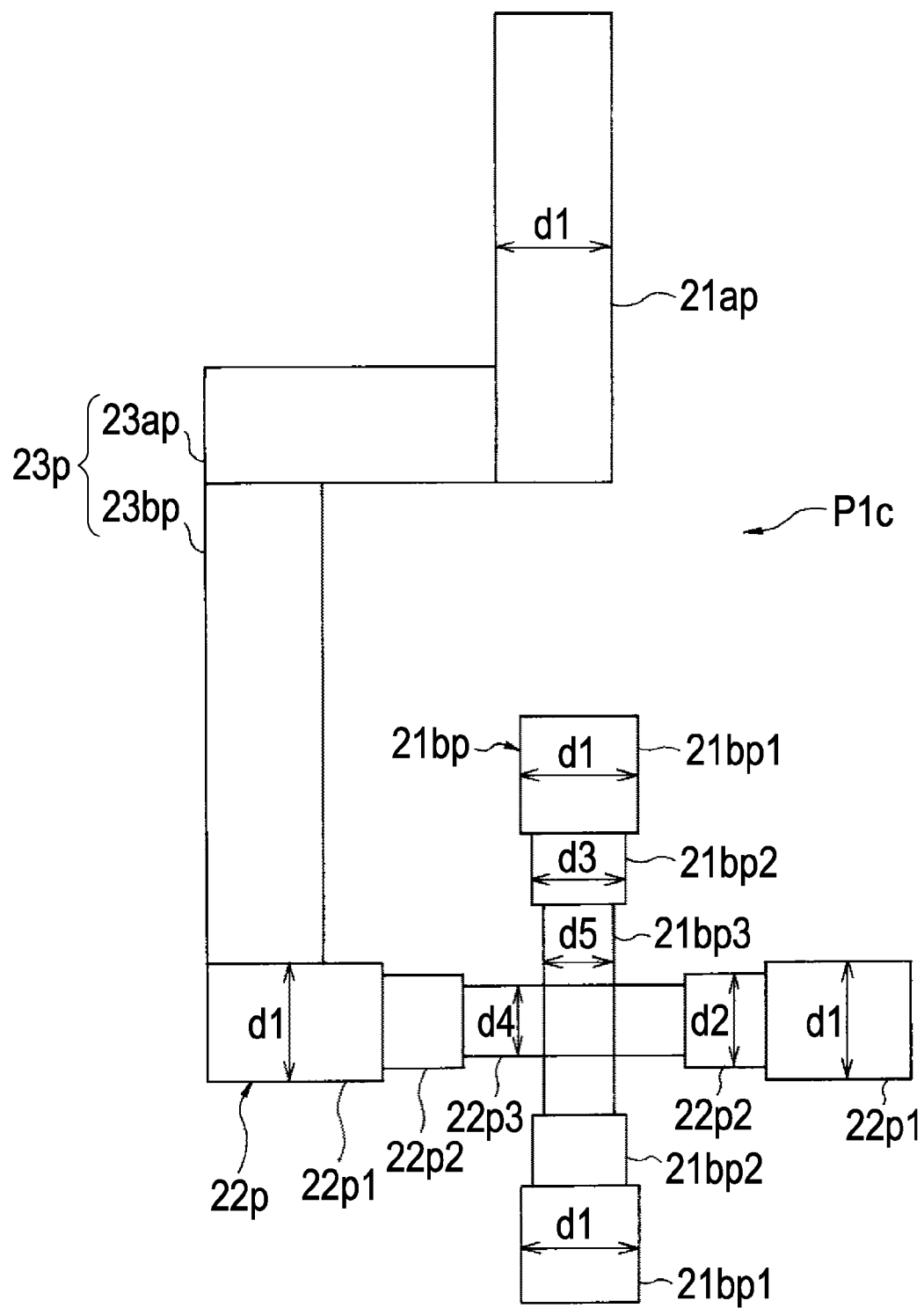
FIG. 36 is a drawing illustrating a modification 3 of the mask used for exposing the plug portion of the moisture-resistant ring.

FIG. 36 is a drawing illustrating a modification 3 of the mask P1.

In a mask P1c in the modification 3, the first extending portion pattern 21ap, the first connecting portion pattern 23ap, and the second connecting portion pattern 23bp have the width d1.

The mask P1c is different from the mask P1b illustrated in FIG. 35 described above, and the first narrow portion 22p2 of the vertical portion pattern 22p has a first drawdown portion 22p3 having a narrower portion at a center thereof. The first drawdown portion 22p3 has a width d4, and the width d4 satisfies a relationship d4<d2.

Also, the mask P1c is different from the mask P1b illustrated in FIG. 35 described above, and the second narrow portion 21bp2 of the second extending portion pattern 21bp has a second drawdown portion 21bp3 having a narrower portion at a center thereof. The second drawdown portion 21bp3 has a width d5, and the width d5 satisfies a relationship d5<d3.

The width d4 of the first drawdown portion 22p3 and the width d5 of the second drawdown portion 21bp3 of the second extending portion pattern 21bp are set adequately together with the widths d1, d2, and d3 depending on the exposure conditions so that the wider portion is not generated in the plug portion RP1. The width d2 and the width d3 may be the same. The width d4 and the width d5 may be the same.

The descriptions of the modifications of the mask P1 described above are applied to the case where other plug portions of the moisture-resistant ring 20 are formed.

In the present embodiment, the semiconductor device and the method of manufacturing the same in the above-described respective embodiments may be modified as needed without departing from the scope of the present invention.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate on which an internal circuit is formed in a central position;
   an insulating layer formed over the semiconductor substrate; and
   a moisture-resistant ring formed by a metal plug embedded in the insulating layer, the moisture-resistant ring surrounding the internal circuit, the moisture-resistant ring extending over the semiconductor substrate in a shape, the moisture-resistant ring including:
   a first extending portion linearly extending in the insulating layer and in a first direction in parallel to the surface of the semiconductor substrate;
   a vertical portion connected to the first extending portion extending in the insulating layer and in a second direction orthogonal to the first extending portion and in parallel to the surface of the semiconductor substrate; and
   a second extending portion linearly extending in the insulating layer and orthogonal to the vertical portion and in parallel to the surface of the semiconductor substrate, the second extending portion spaced apart from the first extending portion, the second extending portion crossing the vertical portion.

2. The semiconductor device according to claim 1, wherein the vertical portion and the second extending portion have a same width.

3. The semiconductor device according to claim 1, wherein the first extending portion and the vertical portion are respectively spaced apart, and the first extending portion and the vertical portion are connected by a joint portion, the joint portion including a first connecting portion vertically bending with respect to the first extending portion and parallel to the surface of the semiconductor substrate, and a second connecting portion vertically bending with respect to the first connecting portion and parallel to the surface of the semiconductor substrate, the second connecting portion connecting the vertical portion.

4. The semiconductor device according to claim 1, wherein the first extending portion and the vertical portion are respectively spaced apart, and the first extending portion and the vertical portion are connected by a joint portion, the joint portion forming a shape of a closed loop in cooperation with the vertical portion.

5. The semiconductor device according to claim 1, wherein the first extending portion and the vertical portion are respectively spaced apart, and the first extending portion and the vertical portion are connected by a joint portion, the joint portion including a plurality of connecting portion formed in a linear shape and parallel to the surface of the semiconductor substrate, the respective connecting portions connect forming a first obtuse angle by end portion of the respective connecting portions, the connecting portion connecting the first extending portion connects the first extending portion forming a second obtuse angle by end portion of the connecting portion and the first extending portion, and the connecting portion connecting the vertical portion connects the vertical portion forming a third obtuse angle by end portion of the connecting portion and the vertical portion.

6. The semiconductor device according to claim 1, wherein the vertical portion and the second extending portion are formed by the metal plug.

7. The semiconductor device according to claim 2, wherein the plug portion includes a second vertical portion having the same length with the vertical portion and parallel to the surface of the semiconductor substrate, the second vertical portion being opposed to the vertical portion, the second vertical portion spaced apart from the vertical portion, the second vertical portion connecting to the first extending portion, and a pair of connecting portions connecting each opposing end portion of the vertical portion and the second vertical portion and parallel to the surface of the semiconductor substrate.

8. The semiconductor device according to claim 3, further comprising:
   a plurality of the insulating layers; and
   a wiring layer formed between the respective insulating layers; and
   wherein the moisture-resistant ring includes a plug portion formed in the insulating layer, and a wiring portion formed in the wiring layer and parallel to the surface of the semiconductor substrate, the wiring portion connecting the plug portion adjacent to the wiring portion, and the first extending portion, the vertical portion and the second extending portion are formed in the same insulating layer.

9. The semiconductor device according to claim 7, wherein the first extending portion is spaced apart from the second vertical portion.

10. The semiconductor device according to claim 8, wherein the wiring portion formed in the insulating layer adjacent to the insulating layer is formed over the first extending portion, the vertical portion and the second extending portion.

11. The semiconductor device according to claim 8, wherein the wiring portion over the vertical portion and the joint portion has the width greater than that of all the rest of the wiring portion.

12. The semiconductor device according to claim 8, wherein the first extending portion includes a first wide potion having a first width and a first narrow portion having a second width narrower than the first width, the second extending portion includes a second wide pattern having a third width and a second narrow portion having a fourth width narrower than the third width, and the first narrow portion of the first extending portion is orthogonal to the second narrow portion of the second extending portion.

13. The semiconductor device according to claim 10, wherein the first extending portion, the vertical portion, the joint portion and the second extending portion have the depth and the width as the same as the plug portion formed in the same insulating layer of the internal circuit.

14. The semiconductor device according to claim 12, wherein the first extending portion includes a first drawdown portion having a fifth width narrower than the second width, the second extending portion includes a second drawdown portion having a sixth width narrower than the fourth width, and the first drawdown portion of the first extending portion is orthogonal to the second drawdown portion of the second extending portion.

15. A method of manufacturing a semiconductor device by exposing a mask layer over a semiconductor substrate by using a first mask and a second mask, the mask layer for forming a via pattern in a groove shape of a moisture-resistant ring, the first mask including a first extending portion pattern linearly extending in a first direction and a vertical portion pattern orthogonal to the first direction, and the second mask including a second extending portion pattern linearly extending in the first direction, the method comprising:

exposing a first via pattern on the mask layer by using one of the first or second masks so that a part of the groove shape of the moisture-resistant ring is formed on the mask layer; and exposing a second via pattern on the mask layer by using the other one of the first or second masks so that all of the groove shape of the moisture-resistant ring is formed on the mask layer;

wherein the exposing the first and second via pattern on the mask layer is performed by forming a first portion exposed by the vertical portion pattern and a second portion exposed by the second extending portion pattern orthogonal, and forming a third portion exposed by the first extending portion pattern and the second portion of the second extending portion pattern spaced apart, the third portion connecting to the first portion; and the moisture-resistant ring includes:

a first extending portion linearly extending in an insulating layer formed over the semiconductor substrate and in a first direction in parallel to the surface of the semiconductor substrate;

a vertical portion connected to the first extending portion extending in the insulating layer and in a second direction orthogonal to the first extending portion and in parallel to the surface of the semiconductor substrate; and a second extending portion linearly extending in the insulating layer and orthogonal to the vertical portion and in parallel to the surface of the semiconductor substrate, the second extending portion spaced apart from the first extending portion, the second extending portion crossing the vertical portion.

16. The method according to claim 15, further comprising forming the vertical portion pattern of the first mask and the second extending pattern of the second mask having the same width respectively.

17. The method according to claim 15, further comprising:
forming the width of the vertical portion pattern of the first mask smaller than the width of the first extending portion pattern;
forming the second extending portion pattern having a wide portion and a narrow portion, the wide portion having the same width as the first extending portion pattern, and the narrow portion having narrower width than the first extending portion pattern; and
exposing the mask layer such that the vertical portion pattern orthogonal to the narrow portion of the second extending portion pattern.

18. The method according to claim 15, further comprising:
forming the width of the vertical portion pattern of the first mask smaller than the width of the first extending portion pattern;
forming the second extending portion pattern having a second wide portion and a second narrow portion, the second wide portion having the same width as the first extending portion pattern, and the second narrow portion having narrower width than the first extending portion pattern; and
exposing the mask layer such that the first narrow portion of the vertical portion pattern orthogonal to the second narrow portion of the second extending portion pattern.

19. The method according to claim 16, wherein the exposing the first via pattern on the mask layer by using one of the first or second masks so that the part of the groove shape of the moisture-resistant ring is formed on the mask layer and the exposing the second via pattern on the mask layer by using the other one of the first or second masks so that all of the groove shape of the moisture-resistant ring is formed on the mask layer is performed by forming a amount of the distance spaced apart between first portion exposed by the first extending portion pattern with respect to the first mask and second portion exposed by the second extending portion pattern with respect to the second mask being greater than a sum of a first displacement and a second displacement, the first displacement of the position exposed by the first extending portion pattern with respect to the original position where the first extending portion pattern may be exposed and the second displacement of the position exposed by the second extending portion pattern with respect to the original position where the second extending portion pattern may be exposed.

20. The method according to claim 19, further comprising forming the first extending portion pattern of the first mask and the second extending portion pattern of the second mask having the same width respectively; and wherein the forming the amount of the distance spaced apart between first portion exposed by the first extending portion pattern with respect to the first mask and second portion exposed by the second extending portion pattern with respect to the second mask is performed by forming the amount of the distance being greater than the sum of the first displacement, the second displacement and the width of the first extending portion pattern or the second extending portion pattern.

21. A method of manufacturing a semiconductor device by exposing a mask layer over a semiconductor substrate by using a mask, the mask layer for forming a via pattern in a groove shape of a moisture-resistant ring, the mask including a first extending portion pattern linearly extending in a first direction, a vertical portion pattern orthogonal to the first direction, the first extending portion pattern and the vertical portion pattern formed on one side of the mask, and a second extending portion pattern extending parallel to the first direction, the second extending portion pattern formed on the other side of the mask, the method comprising:

exposing a first extending portion pattern, a vertical portion pattern and a second extending portion pattern on a first area of the mask layer;

arranging the mask over the mask layer from the first area to a second area, the second area adjacent to the first area;

exposing a first extending portion pattern, a vertical portion pattern and a second extending portion pattern on the second area of the mask layer such that the vertical portion pattern exposed on the first area is orthogonal to the second extending portion pattern exposed on the second area, and the vertical portion pattern is connected to the first extending portion pattern; and the moisture-resistant ring includes:

a first extending portion linearly extending in an insulating layer formed over the semiconductor substrate and in a first direction in parallel to the surface of the semiconductor substrate;

a vertical portion connected to the first extending portion extending in the insulating layer and in a second direction orthogonal to the first extending portion and in parallel to the surface of the semiconductor substrate; and a second extending portion linearly extending in the insulating layer and orthogonal to the vertical portion and in parallel to the surface of the semiconductor substrate, the second extending portion spaced apart from the first extending portion, the second extending portion crossing the vertical portion.

\* \* \* \* \*